(12) United States Patent
Son et al.

(10) Patent No.: US 11,900,886 B2
(45) Date of Patent: Feb. 13, 2024

(54) DISPLAY DEVICE

(71) Applicant: Samsung Display Co., LTD., Yongin-si (KR)

(72) Inventors: Sun Kwun Son, Yongin-si (KR); Dong Hee Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/093,362

(22) Filed: Jan. 5, 2023

(65) Prior Publication Data

US 2023/0360609 A1    Nov. 9, 2023

(30) Foreign Application Priority Data

May 9, 2022    (KR) .......................... 10-2022-0056518

(51) Int. Cl.
*G09G 3/3266* (2016.01)
*G09G 3/3275* (2016.01)

(52) U.S. Cl.
CPC .......... *G09G 3/3266* (2013.01); *G09G 3/3275* (2013.01)

(58) Field of Classification Search
CPC ............... G09G 3/3266; G09G 3/3275; G09G 2300/0426; H01L 27/124; H10K 59/131; G02F 1/13452; G02F 1/1345; H05K 3/361

USPC ........................................ 349/149, 150, 152
See application file for complete search history.

(56) References Cited

U.S. PATENT DOCUMENTS

| 9,389,476 B2* | 7/2016 | Park ...................... G09G 3/3677 |
| 2022/0285427 A1 | 9/2022 | Son et al. |
| 2022/0310662 A1* | 9/2022 | Cha .......................... G09G 3/32 |

FOREIGN PATENT DOCUMENTS

| CN | 115050781 | 9/2022 |
| EP | 4057269 | 9/2022 |
| KR | 10-2021-0085990 | 7/2021 |
| KR | 10-2021-0127270 | 10/2021 |
| KR | 10-2022-0126329 | 9/2022 |

* cited by examiner

*Primary Examiner* — Koosha Sharifi-Tafreshi
(74) *Attorney, Agent, or Firm* — KILE PARK REED & HOUTTEMAN PLLC

(57) ABSTRACT

A display device comprises a first display area comprising stages, and gate input lines electrically connected to the stages and extending in a first direction, a second display area adjacent to the first display area in a second direction intersecting the first direction and comprising data lines, a third display area adjacent to the second display area in the second direction and comprising data lines, connection lines electrically connected to the data lines of the third display area via the second display area, and bypass lines electrically connected to the stages via the third display area and the second display area.

20 Claims, 13 Drawing Sheets

DISPLAY DEVICE

CROSS REFERENCE TO RELATED APPLICATION(S)

This application claims priority to and benefits of Korean Patent Application No. 10-2022-0056518 under 35 U.S.C. § 119, filed on May 9, 2022, in the Korean Intellectual Property Office (KIPO), the entire contents of which are incorporated herein by reference.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device, and an organic light emitting display device. Among the flat panel display devices, in the light emitting display device, since each of pixels of a display panel includes a light emitting element capable of emitting light by itself, an image can be displayed without a backlight unit providing light to the display panel. The light emitting element may be an organic light emitting diode using an organic material as a fluorescent material or an inorganic light emitting diode using an inorganic material as a fluorescent material.

SUMMARY

Aspects of the disclosure provide a display device capable of reducing the cost of a flexible film by including the flexible film formed of a single metal layer.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may comprise a first display area comprising stages, and gate input lines electrically connected to the stages and extending in a first direction, a second display area adjacent to the first display area in a second direction intersecting the first direction and comprising data lines, a third display area adjacent to the second display area in the second direction and comprising data lines, connection lines electrically connected to the data lines of the third display area via the second display area, and bypass lines electrically connected to the stages via the third display area and the second display area.

Each of the gate input lines and the bypass lines may supply a gate input signal or a clock signal to the stages.

The bypass lines may comprise a first bypass line extending in the first direction in the third display area, and a second bypass line electrically connected to the first bypass line and extending from the third display area to the stages.

The second bypass line may intersect the data lines of the second display area. The second bypass line may be insulated from the data lines of the second display area.

The connection lines may comprise a first connection line extending in the first direction in the second display area, and a second connection line electrically connected to the first connection line and extending from the second display area to the data line of the third display area.

The second connection line may intersect the data lines of the second display area. The second connection line may be insulated from the data lines of the second display area.

The second connection line may intersect the first bypass line in the third display area. The second connection line may be insulated from the first bypass line.

The display device may further comprise a flexible film adjacent to the first display area, the second display area, and the third display area in the first direction, and a display driver mounted on the flexible film.

The gate input lines may extend from the flexible film to the first display area. The gate input lines may overlap the display driver on the flexible film in a plan view.

The first bypass line may extend from the flexible film to the third display area. The first bypass line may be spaced apart from the display driver on the flexible film.

The flexible film may further comprise a data output line electrically connected between the data lines of the second display area and the display driver. The gate input lines, the first bypass line, and the data output line may be formed of a same metal layer on the flexible film.

The data output line may be disposed between the gate input lines and the first bypass line.

Each of the first display area, the second display area, and the third display area may further comprise pixels emitting light. The first bypass line may be disposed between the pixels adjacent in the second direction. The second bypass line may be disposed between the pixels adjacent in the first direction.

Each of the stages may comprise a plurality of circuit parts electrically connected to the gate input lines and disposed between the pixels.

According to an embodiment of the disclosure, a display device may comprise a first display area comprising stages, and gate input lines electrically connected to the stages and extending in a first direction, a second display area adjacent to the first display area in a second direction intersecting the first direction, a third display area adjacent to the second display area in the second direction, a flexible film adjacent to the first display area, the second display area, and the third display area in the first direction, and bypass lines electrically connected to the stages via the flexible film, the third display area, and the second display area.

Each of the first display area, the second display area, and the third display area may further comprise data lines extending in the first direction. The display device may further comprise connection lines electrically connected to the data lines of the third display area via the second display area.

The bypass lines may comprise a first bypass line extending in the first direction from the flexible film to the third display area, and a second bypass line electrically connected to the first bypass line and extending from the third display area to the stages.

The connection lines may comprise a first connection line extending in the first direction in the second display area, and a second connection line electrically connected to the first connection line and extending from the second display area to the data line of the third display area.

The display device may further comprise a display driver mounted on the flexible film. The gate input lines may extend from the flexible film to the first display area. The gate input lines may overlap the display driver on the flexible film in a plan view.

The flexible film may further comprise a data output line electrically connected between the data lines of the second display area and the display driver. The gate input lines, the bypass lines, and the data output line may be formed of a same metal layer on the flexible film.

In accordance with the display device according to embodiments, the flexible film may include gate input lines, data output lines, and bypass lines. Since the display device includes the bypass lines, the arrangement area of the gate input lines in the flexible film may be reduced, and power lines, which supply a power voltage to a display panel, may be equally distributed for corresponding pixels. Accordingly, in the flexible film, the gate input lines, the data output lines, and the bypass lines may be formed as a single metal layer, and the cost of the flexible film may be reduced.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
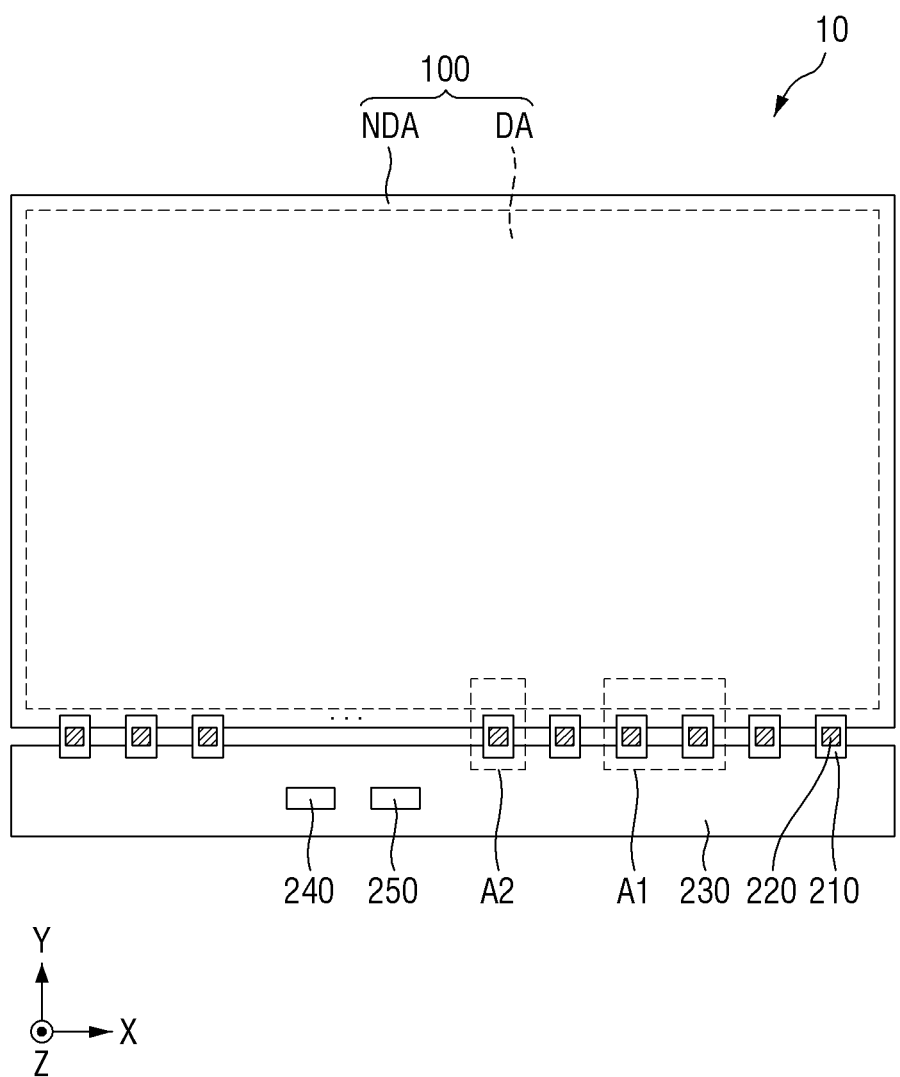
FIG. 1 is a schematic plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "on," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a" and "an" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure are described with reference to the accompanying drawings.

FIG. 1 is a schematic plan view illustrating a display device according to an embodiment.

The terms "above," "top," and "top surface" as used herein may refer to an upward direction (i.e., a Z-axis direction) with respect to the display device. The terms "below," "bottom," and "bottom surface" as used herein may refer to a downward direction (i.e., a direction opposite to the Z-axis direction) with respect to the display device. Further, the terms "left," "right," "upper," and "lower" may respectively indicate corresponding directions on the surface of the display device. For example, the term "left" may indicate a direction opposite to an X-axis direction, the term "right" may indicate the X-axis direction, the term "upper" indicates a Y-axis direction, and the term "lower" may indicate a direction opposite to the Y-axis direction.

Referring to FIG. 1, a display device 10, as a device for displaying a moving or still image, may be employed as a display screen of various products such as a television, a laptop computer, a monitor, a billboard, Internet of Things (IoT) device, or the like, as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, an ultra-mobile PC (UMPC), or the like.

The display device 10 may include a display panel 100, a flexible film 210, a display driver 220, a circuit board 230, a timing controller 240, and a power supply part 250.

The display panel 100 may have a rectangular shape in a plan view. For example, the display panel 100 may have a rectangular shape, in a plan view, having long sides in a first direction (X-axis direction) and short sides in a second direction (Y-axis direction). A corner formed by the long side in the first direction (X-axis direction) and the short side in the second direction (Y-axis direction) may be right-angled or rounded with a predetermined curvature. The planar shape of the display panel 100 is not limited to the rectangular shape, and may be formed in another polygonal shape, a circular shape, or an elliptical shape. For example, the display panel 100 may be formed to be flat, but is not limited thereto. In another example, the display panel 100 may be bent with a curvature (e.g., a predetermined or selectable curvature).

The display panel 100 may include a display area DA and a non-display area NDA.

The display area DA may be defined as a central area of the display panel 100. The display area DA may include pixels to display an image. A pixel may be defined as a minimum unit area for outputting light. Each of the pixels may include an organic light emitting diode (OLED) having an organic light emitting layer, a quantum dot light emitting diode (LED) including a quantum dot light emitting layer, a micro LED, or an inorganic LED having an inorganic semiconductor. In the following, the case where each of the pixels includes an inorganic light emitting diode will be mainly described, but the disclosure is not limited thereto. The non-display area NDA may be defined as a remaining area of the display panel 100 except the display area DA. The non-display area NDA may surround the display area DA, and may not display an image.

Input terminals provided on a side of the flexible film 210 may be attached to the circuit board 230 by a film attaching process, and output terminals provided at another side of the flexible film 210 may be attached to a pad portion by the film attaching process. For example, the flexible film 210 may be implemented as a tape carrier package or a chip on film. The flexible film 210 may be bent toward a lower portion of the display panel 100 to reduce a bezel area of the display device 10.

The display driver 220 may be mounted on the flexible film 210. For example, the display driver 220 may be implemented as an integrated circuit (IC). The display driver 220 may receive digital video data and a data control signal from the timing controller 240, and based on the data control signal, convert the digital video data to an analog data voltage to supply it to data lines DL through fan-out lines. Since the display device 10 includes the display driver 220 disposed on a lower side of the non-display area NDA, sizes of a left side, right side, and upper side of the non-display area NDA may be minimized.

The circuit board 230 may support the timing controller 240 and the power supply part 250, and supply signals and power to the display driver 220. For example, the circuit board 230 may supply a signal supplied from the timing controller 240 and a power voltage supplied from the power supply part 250 to the display driver 220 to display an image on each pixel. To this end, a signal transmission line and a power line may be provided on the circuit board 230.

The timing controller 240 may be mounted on the circuit board 230, and may receive image data and a timing synchronization signal supplied from display driving system or a graphic device through a user connector provided on the circuit board 230. The timing controller 240 may generate digital video data by arranging the image data to fit a pixel arrangement structure based on the timing synchronization signal, and may supply the generated digital video data to the display driver 220. The timing controller 240 may generate the data control signal and a gate control signal based on the timing synchronization signal. The timing controller 240 may control supply timing of the data voltage of the display driver 220 based on the data control signal. The timing controller 240 may supply a gate input signal to a gate driver or a stage based on the gate control signal.

The power supply part 250 may be disposed on the circuit board 230, and may supply a power voltage to the display driver 220 and the display panel 100. For example, the power supply part 250 may generate a high potential voltage, a low potential voltage, or an initialization voltage, and supply it to the display panel 100.

Figure 2:
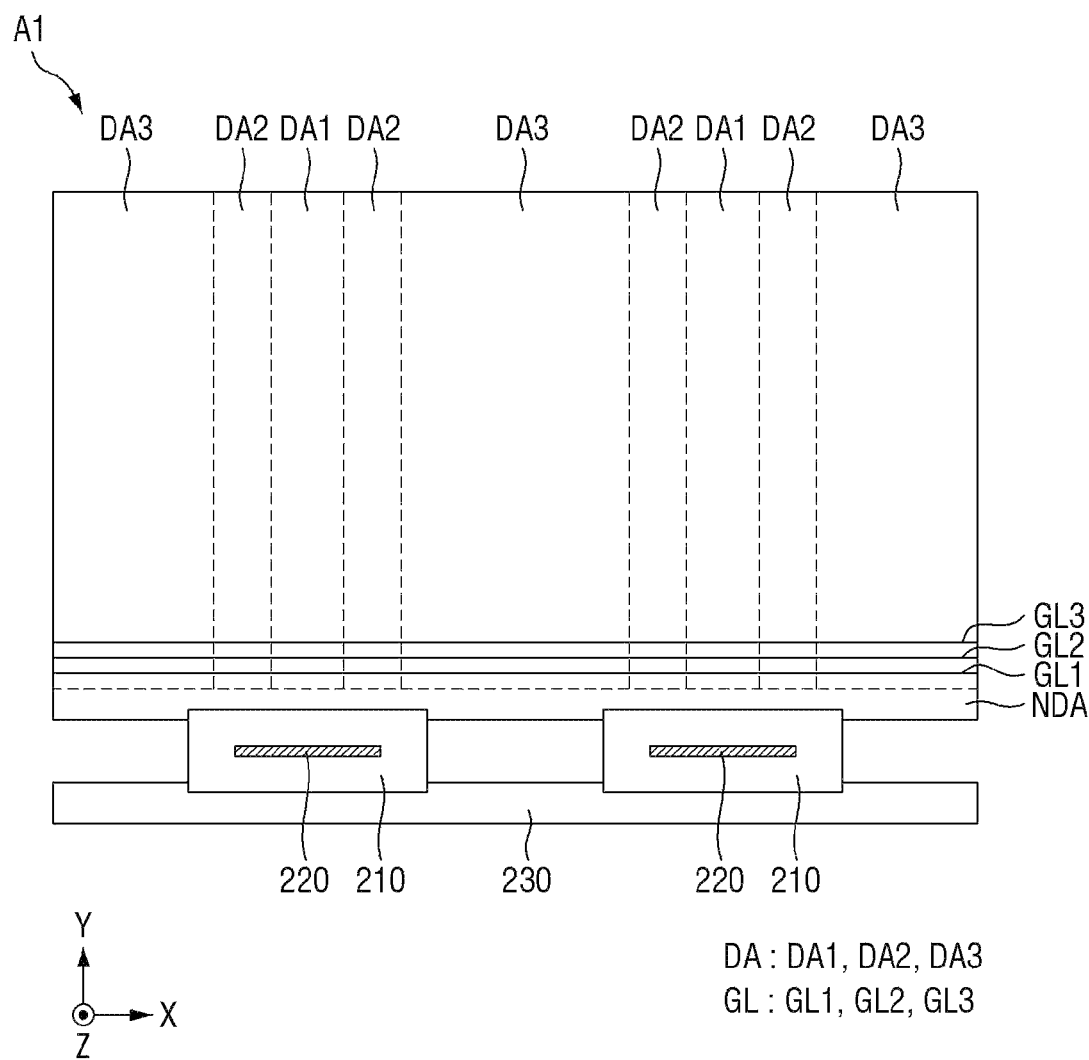
FIG. 2 is a schematic enlarged view of area A1 of FIG. 1.
Figure 3:
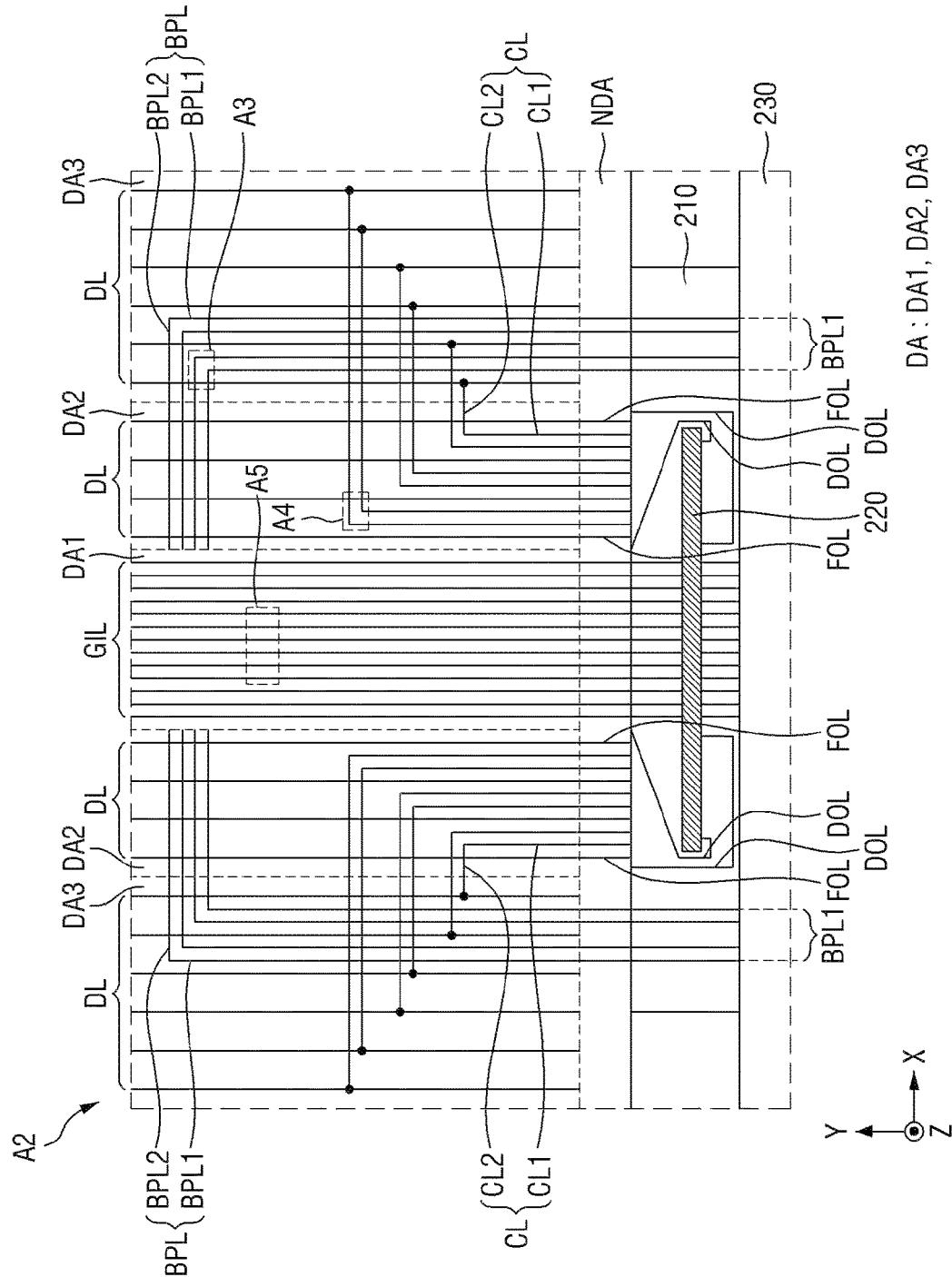
FIG. 3 is a schematic enlarged view of area A2 of FIG. 1.

FIG. 2 is a schematic enlarged view of area A1 of FIG. 1. FIG. 3 is a schematic enlarged view of area A2 of FIG. 1.

Referring to FIGS. 2 and 3, the display area DA may include first to third display areas DA1, DA2, and DA3.

The first display areas DA1 may correspond to the flexible films 210 or the display drivers 220. One first display area DA1 may correspond to one flexible film 210 and one display driver 220, but is not limited thereto. The first display area DA1 may include gate input lines GIL and stages STG.

The gate input lines GIL may extend in the second direction (Y-axis direction) while being spaced apart from each other in the first direction (X-axis direction). The gate input line GIL may supply a gate input signal, a clock signal, and a power voltage to the stages STG. The gate input line GIL may extend from the timing controller 240 to the first display area DA1 via the circuit board 230, the flexible film 210, and the non-display area NDA. The gate input lines GIL may extend in the second direction (Y-axis direction) through a central portion of the flexible film 210. The gate input lines GIL may overlap the display driver 220 on the flexible film 210, but locations of the gate input lines GIL are not limited thereto. The gate input lines GIL may not overlap data output lines DOL and bypass lines BPL.

The stages STG may be arranged in the first display area DA1 in the second direction (Y-axis direction). The stage STG may receive the gate input signal, the clock signal, and the power voltage from the gate input lines GIL to generate a gate signal. The stage STG may supply the gate signal to a gate line GL. For example, the stages STG may include first to third stages STG1, STG2, and STG3, and the gate lines GL may include first to third gate lines GL1, GL2, and GL3. The first to third stages STG1, STG2, and STG3 may supply gate signals to the first to third gate lines GL1, GL2, and GL3, respectively. Since the display device 10 includes the stages STG disposed in the display area DA, an area of the non-display area NDA may be minimized.

Although not shown in FIG. 3, similarly to the second display area DA2, the first display area DA1 may include a data line DL that is electrically connected to the display driver 220. The data line DL of the first display area DA1 may receive a data voltage from the display driver 220.

The second display areas DA2 may be disposed on sides of the first display area DA1. The second display area DA2 may be disposed between the first display area DA1 and the third display area DA3. The second display area DA2 may include the data lines DL, connection lines CL, and second bypass lines BPL2.

The data lines DL may extend in the second direction (Y-axis direction) while being spaced apart from each other in the first direction (X-axis direction). The data line DL of the second display area DA2 may be electrically connected to the display driver 220 via a fan-out line FOL of the non-display area NDA and a data output line DOL of the flexible film 210. The data line DL may receive a data voltage from the display driver 220, and may supply the data voltage to the pixels. The data line DL may be made of (or include) a same material on a same layer as the gate input line GIL and a first connection line CL1, but is not limited thereto.

The connection lines CL may electrically connect the display driver 220 to the data line DL of the third display area DA3. The connection line CL may include first and second connection lines CL1 and CL2. The first connection lines CL1 may extend in the second direction (Y-axis direction) while being spaced apart from each other in the first direction (X-axis direction). The first connection lines CL1 may be disposed parallel to the data lines DL. The first connection line CL1 may be electrically connected to the display driver 220 via the fan-out line FOL of the non-display area NDA and the data output line DOL of the flexible film 210. The second connection lines CL2 may extend in the first direction (X-axis direction) while being spaced apart from each other in the second direction (Y-axis direction). The second connection line CL2 may extend from the second display area DA2 to the third display area DA3. The second connection lines CL2 may cross the data lines DL of the second display area DA2, but may be insulated from the data lines DL. The second connection lines CL2 may cross first bypass lines BPL1, but may be insulated from the first bypass lines BPL1. The connection line CL may receive a data voltage from the display driver 220, and may supply the data voltage to the data line DL of the third display area DA3.

The third display area DA3 may be disposed between the second display areas DA2 that are adjacent in the first direction (X-axis direction). The third display area DA3 may include the data lines DL, bypass lines BPL, and the second connection lines CL2.

The data lines DL may extend in the second direction (Y-axis direction) while being spaced apart from each other in the first direction (X-axis direction). The data line DL of the third display area DA3 may be electrically connected to the fan-out line FOL of the non-display area NDA via the connection line CL. The data line DL may receive a data voltage from the display driver 220, and may supply the data voltage to the pixels. The data line DL may be made of a same material on a same layer as the first bypass line BPL1, but is not limited thereto.

The bypass lines BPL may electrically connect the stage STG of the first display area DA1 to the circuit board 230. The bypass line BPL may supply a gate input signal, a clock signal, and a power voltage to the stages STG. The bypass line BPL may include the first and second bypass lines BPL1 and BPL2. The first bypass lines BPL1 may extend in the second direction (Y-axis direction) while being spaced apart from each other in the first direction (X-axis direction). The first bypass lines BPL1 may be disposed parallel to the data lines DL. The first bypass line BPL1 may extend from the timing controller 240 to the third display area DA3 via the circuit board 230, the flexible film 210, and the non-display area NDA. The first bypass lines BPL1 may cross the second connection lines CL2 of the third display area DA3, but may be insulated from the second connection lines CL2. The second bypass lines BPL2 may extend in the first direction (X-axis direction) while being spaced apart from each other in the second direction (Y-axis direction). The second bypass line BPL2 may extend from the third display area DA3 to the first display area DA1. The second bypass line BPL2 may electrically connect the stage STG of the first display area DA1 to the first bypass line BPL1. The second bypass lines BPL2 may cross the data lines DL of the second display area DA2, but may be insulated from the data lines DL.

Since the display device 10 includes the bypass lines BPL that are electrically connected to the stages STG of the first display area DA1 via the second and third display areas DA2 and DA3, it is possible to reduce an integration area of the stages STG and a size of the first display area DA1. Since the display device 10 includes the bypass lines BPL, it is possible to decrease the number of transistors in each stage STG, but the disclosure is not limited thereto.

The flexible film 210 may include the gate input lines GIL, the data output lines DOL, and the first bypass lines BPL1. Since the display device 10 includes the bypass lines BPL, an arrangement area of the gate input lines GIL in the flexible film 210 may be reduced, and power supply lines, which supply the power voltage to the display panel 100, may be equally distributed for the respective pixels. Accordingly, in the flexible film 210, the gate input lines GIL, the data output lines DOL, and the first bypass lines BPL1 may be formed as a single metal layer. The display device 10 may include the flexible film 210 formed of the single metal layer, and thus a cost of the flexible film 210 may be reduced.

Since the display device 10 includes the connection line CL that is electrically connected to the data lines DL of the third display area DA3 via the second display area DA2, an area of the fan-out lines FOL may be minimized. The fan-out lines FOL may extend in parallel in the second direction (Y-axis direction) in the non-display area NDA. For example, as the display device 10 omits a fan-out line that directly connects the flexible film 210 to the data lines DL of the third display area DA3, and thus an area of the non-display area NDA may be minimized.

Figure 4:
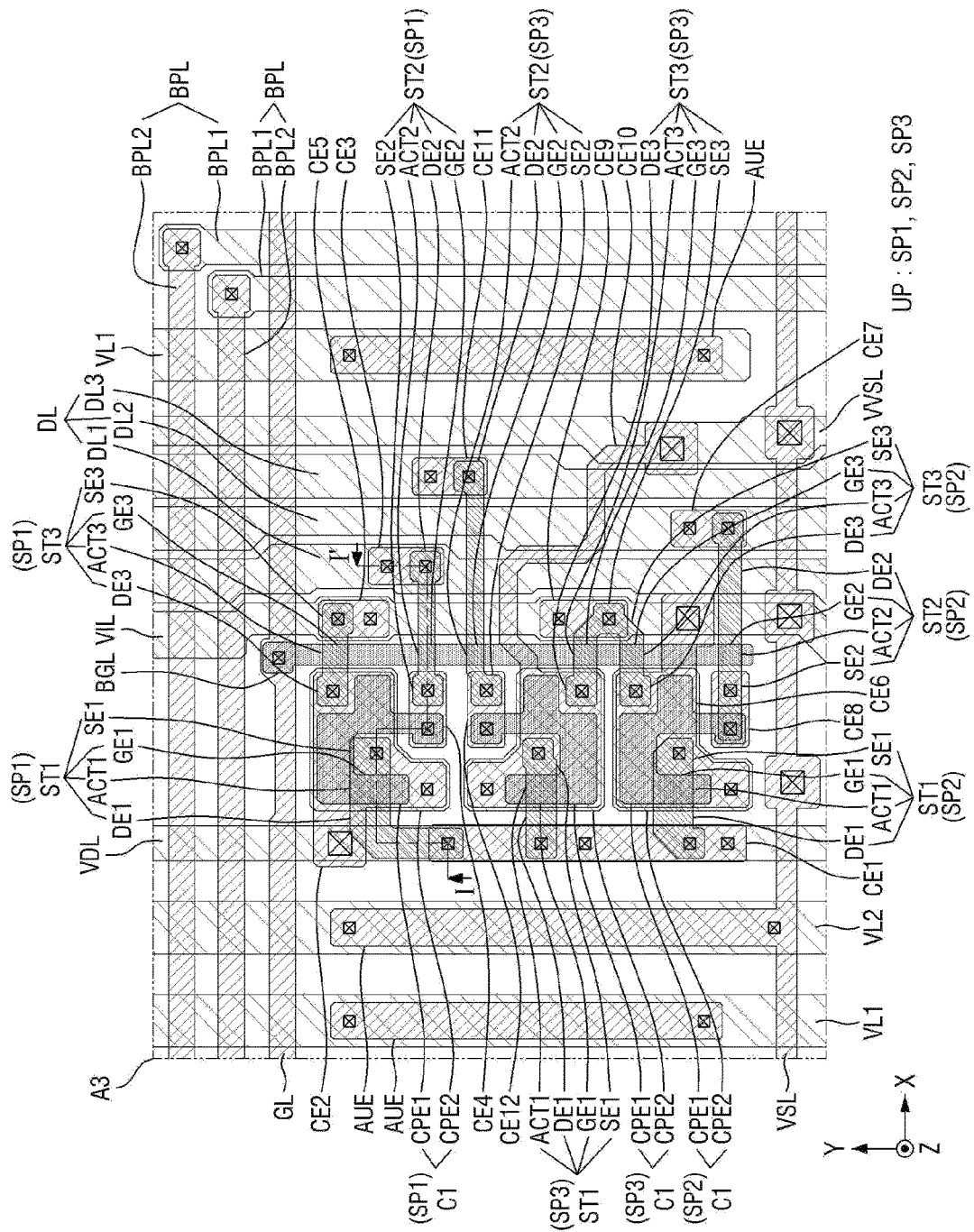
FIGS. 4 and 5 are schematic enlarged views of area A3 of FIG. 3.
Figure 5:
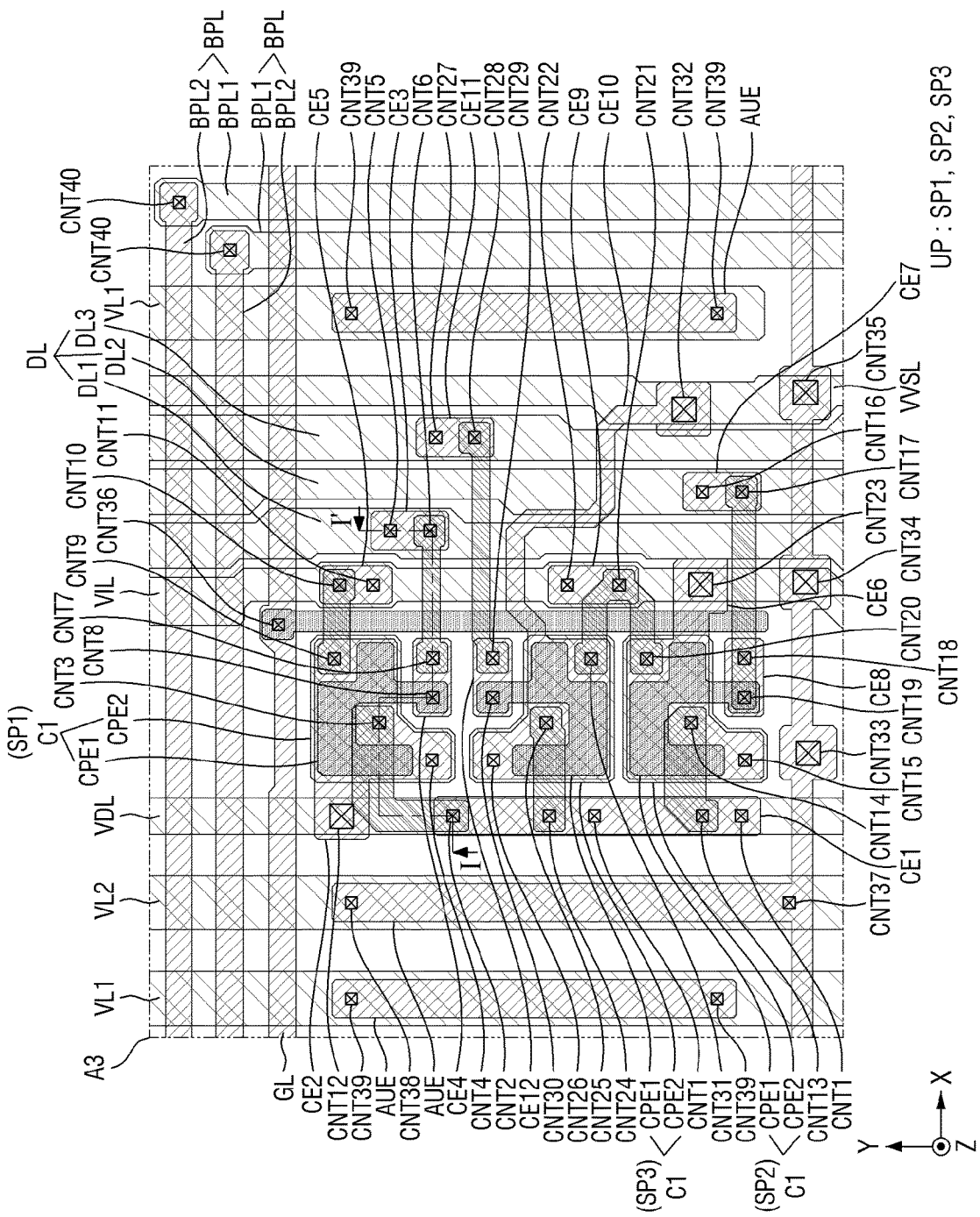
Figure 6:
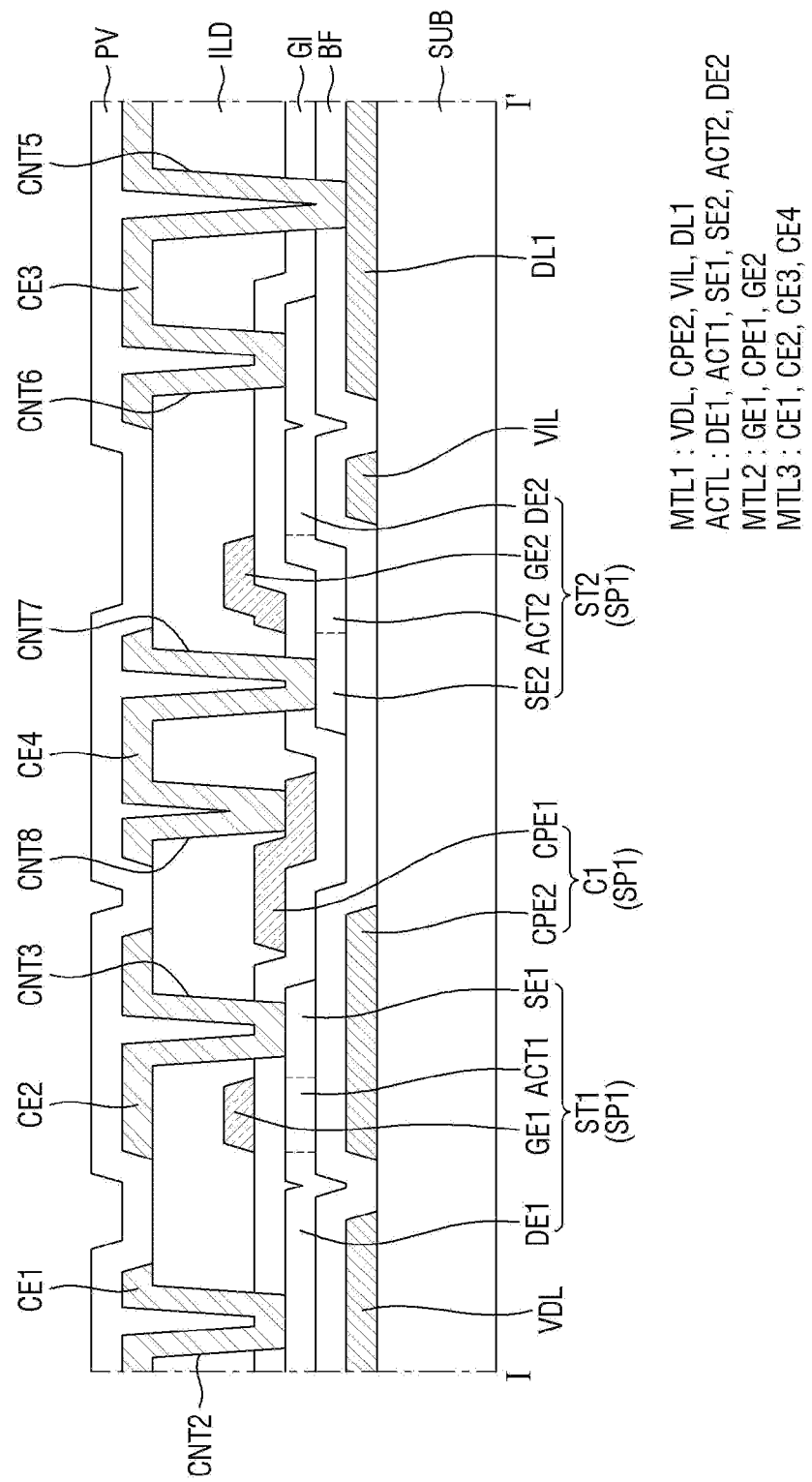
FIG. 6 is a schematic cross-sectional view taken along line I-I' of FIGS. 4 and 5.
Figure 7:
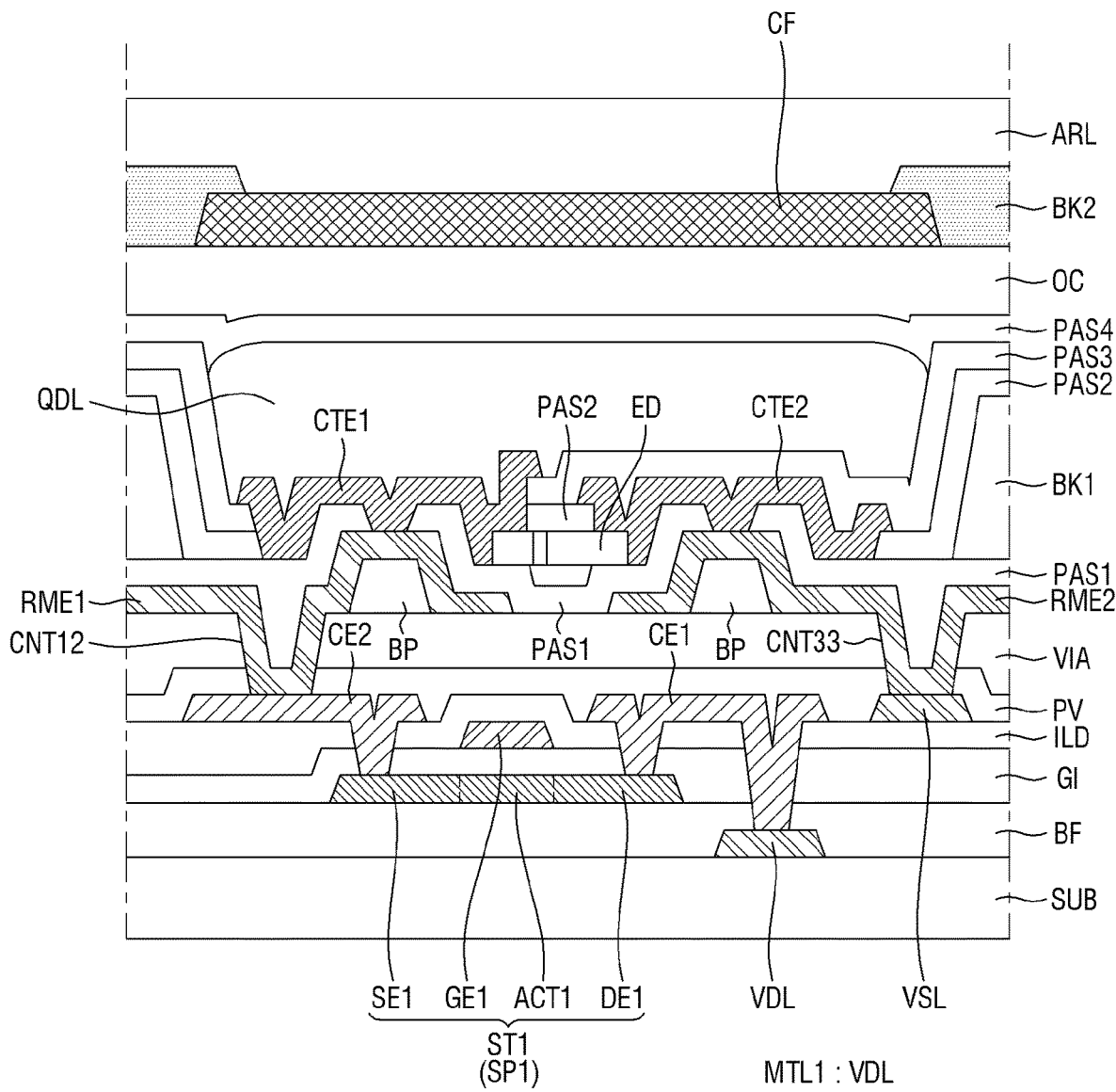
FIG. 7 is a schematic cross-sectional view showing a display device according to an embodiment.
Figure 8:
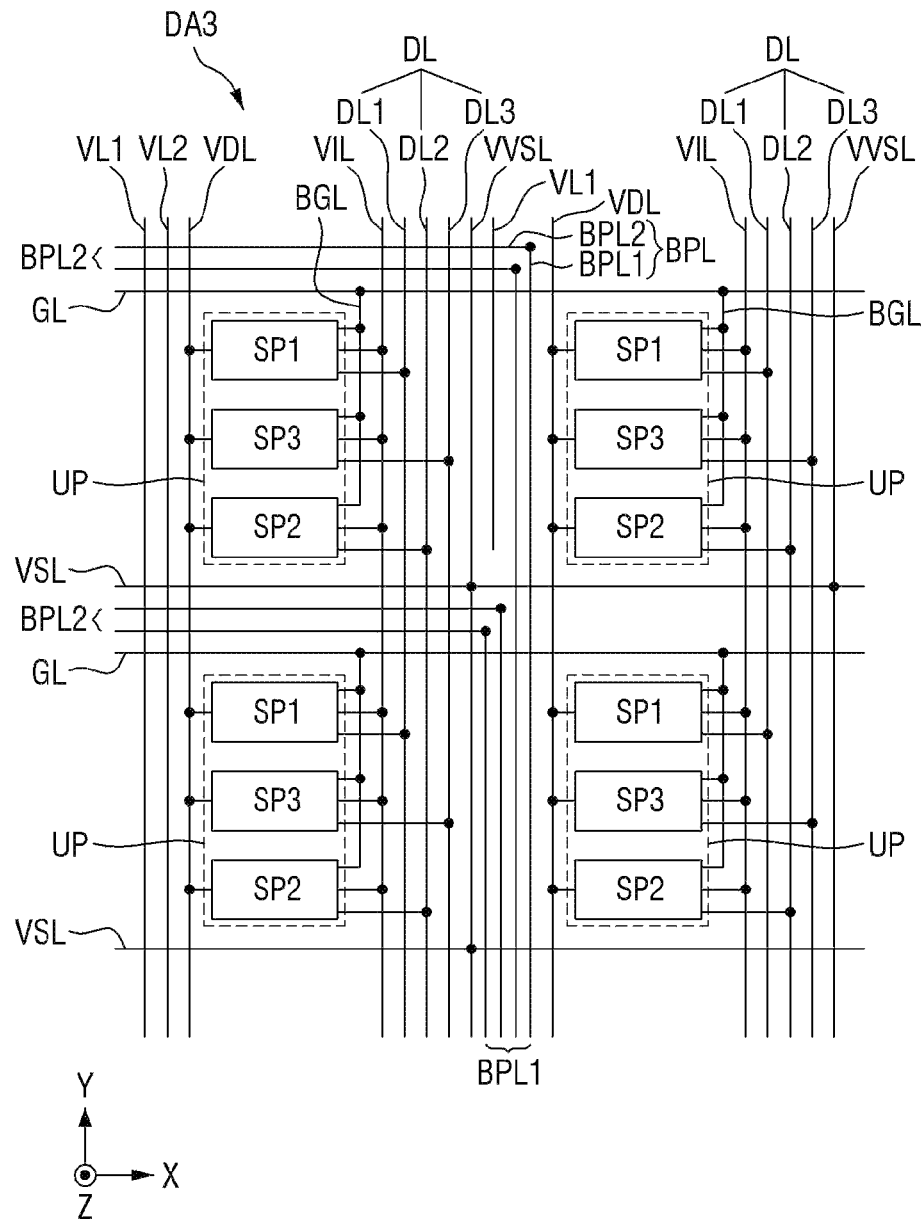
FIG. 8 is a schematic view illustrating pixels and lines in a third display area in a display device according to an embodiment.

FIGS. 4 and 5 are schematic enlarged views of area A3 of FIG. 3. FIGS. 4 and 5 illustrate by dividing reference numerals of a same view. FIG. 6 is a schematic cross-sectional view taken along line I-I' of FIGS. 4 and 5, and FIG. 7 is a schematic cross-sectional view showing a display device according to an embodiment. FIG. 8 is a schematic view illustrating pixels and lines in a third display area in a display device according to an embodiment.

Referring to FIGS. 4 to 8, the third display area DA3 may include a unit pixel (or pixel) UP, a high potential line VDL, the gate line GL, an auxiliary gate line BGL, an initialization voltage line VIL, the data line DL, a vertical voltage line VVSL, a low potential line VSL, a first voltage line VL1, a second voltage line VL2, and the bypass line BPL. The unit pixels UP may include first to third pixels SP1, SP2, and SP3. A pixel circuit of the first pixel SP1, a pixel circuit of the third pixel SP3 and a pixel circuit of the second pixel SP2 may be arranged in a direction opposite to the second direction (Y-axis direction).

The first voltage line VL1 may be disposed in a first metal layer MTL1 on a substrate SUB, and may extend in the second direction (Y-axis direction). The first voltage line VL1 may be electrically connected to the high potential line VDL. The first voltage line VL1 may overlap an auxiliary electrode AUE of a third metal layer MTL3 in a thickness direction (Z-axis direction), and may be connected to the auxiliary electrode AUE through thirty-ninth contact holes CNT39. Accordingly, the first voltage line VL1 may reduce line resistance by being connected to the auxiliary electrode AUE.

The second voltage line VL2 may be disposed in the first metal layer MTL1, and may extend in the second direction (Y-axis direction). The second voltage line VL2 may be disposed on a right side of the first voltage line VL1. The second voltage line VL2 may be connected to the low potential line VSL through a thirty-seventh contact hole CNT37. The second voltage line VL2 may overlap the auxiliary electrode AUE of the third metal layer MTL3 in the thickness direction (Z-axis direction), and may be connected to the auxiliary electrode AUE through a thirty-eighth contact hole CNT38. Accordingly, the second voltage line VL2 may reduce line resistance by being connected to the auxiliary electrode AUE. The auxiliary electrode AUE, which is connected to the second voltage line VL2, may be integral with the low potential line VSL, but is not limited thereto.

The high potential line VDL may be disposed in the first metal layer MTL1 on the substrate SUB, and may extend in the second direction (Y-axis direction). The high potential line VDL may be disposed on a left side of the pixel circuits of the first to third pixels SP1, SP2, and SP3. The high potential line VDL may be connected to a first connection electrode CE1 of the third metal layer MTL3 through a first contact hole CNT1. The first connection electrode CE1 may overlap the high potential line VDL (e.g., in the thickness direction (Z-axis direction)). The first connection electrode CE1 may be connected to a drain electrode DE1 of a first transistor ST1 of the first pixel SP1 through a second contact hole CNT2. The first connection electrode CE1 may be connected to a drain electrode DE1 of a first transistor ST1 of the second pixel SP2 through a thirteenth contact hole CNT13. The first connection electrode CE1 may be connected to the drain electrode DE1 of the first transistor ST1 of the third pixel SP3 through a twenty-fourth contact hole CNT24. The high potential line VDL may supply a high potential voltage to each of the first to third pixels SP1, SP2, and SP3.

The gate line GL may be disposed in the third metal layer MTL3 on an interlayer insulating layer ILD, and may extend in the first direction (X-axis direction). The gate line GL may be disposed above the pixel circuit of the first pixel SP1. The gate line GL may be connected to an auxiliary gate line BGL through a thirty-sixth contact hole CNT36. The gate line GL may supply a gate signal received from the stage STG to the auxiliary gate line BGL.

The auxiliary gate line BGL may be disposed in a second metal layer MTL2. The second metal layer MTL2 may be disposed on a gate insulating layer GI covering an active layer ACTL. The auxiliary gate line BGL may extend from the gate line GL in a direction opposite to the second direction (Y-axis direction). The auxiliary gate line BGL may be disposed on a right side of the pixel circuits of the first to third pixels SP1, SP2, and SP3. The auxiliary gate line BGL may supply the gate signals received from the gate line GL to the first to third pixels SP1, SP2, and SP3.

The initialization voltage line VIL may be disposed in the first metal layer MTL1, and may extend in the second direction (Y-axis direction). The initialization voltage line VIL may be disposed on a right side of the auxiliary gate line BGL. The initialization voltage line VIL may be connected to a fifth connection electrode CE5 of the third metal layer MTL3 through an eleventh contact hole CNT11, and the fifth connection electrode CE5 may be connected to a source electrode SE3 of a third transistor ST3 of the first pixel SP1 through a tenth contact hole CNT10. The initialization voltage line VIL may be connected to a ninth connection electrode CE9 of the third metal layer MTL3 through a twenty-second contact hole CNT22. The ninth connection electrode CE9 may be connected to a source electrode SE3 of a third transistor ST3 of the second pixel SP2 and a source electrode SE3 of a third transistor ST3 of the third pixel SP3 through a twenty-first contact hole CNT21. The source electrode SE3 of the third transistor ST3 of the second pixel SP2 and the source electrode SE3 of the third transistor ST3 of the third pixel SP3 may be integral with each other, but are not limited thereto. Accordingly, the initialization voltage line VIL may supply the initialization voltage to the third transistor ST3 of each of the first to third pixels SP1, SP2, and SP3, and may receive a sensing signal from the third transistor ST3.

The first data line DL1 may be disposed in the first metal layer MTL1, and may extend in the second direction (Y-axis direction). The first data line DL1 may be disposed on a right side of the initialization voltage line VIL. The first data line DL1 may be connected to a third connection electrode CE3 of the third metal layer MTL3 through a fifth contact hole CNT5, and the third connection electrode CE3 may be connected to a drain electrode DE2 of a second transistor ST2 of the first pixel SP1 through a sixth contact hole CNT6. The first data line DL1 may supply a data voltage to the second transistor ST2 of the first pixel SP1.

The second data line DL2 may be disposed in the first metal layer MTL1, and may extend in the second direction (Y-axis direction). The second data line DL2 may be disposed on a right side of the first data line DL1. The second data line DL2 may be connected to a seventh connection electrode CE7 of the third metal layer MTL3 through a sixteenth contact hole CNT16, and the seventh connection electrode CE7 may be connected to a drain electrode DE2 of a second transistor ST2 of the second pixel SP2 through a seventeenth contact hole CNT17. The second data line DL2 may supply a data voltage to the second transistor ST2 of the second pixel SP2.

The third data line DL3 may be disposed in the first metal layer MTL1, and may extend in the second direction (Y-axis direction). The third data line DL3 may be disposed on a right side of the second data line DL2. The third data line DL3 may be connected to an eleventh connection electrode CE11 of the third metal layer MTL3 through a twenty-seventh contact hole CNT27, and the eleventh connection electrode CE11 may be connected to a drain electrode DE2 of a second transistor ST2 of the third pixel SP3 through a twenty-eighth contact hole CNT28. The third data line DL3 may supply a data voltage to the second transistor ST2 of the third pixel SP3.

The vertical voltage line VVSL may be disposed in the first metal layer MTL1, and may extend in the second direction (Y-axis direction). The vertical voltage line VVSL may be disposed on a right side of the third data line DL3. The vertical voltage line VVSL may supply a low potential voltage to the low potential line VSL.

The low potential line VSL may be disposed in the third metal layer MTL3, and may extend in the first direction (X-axis direction). The low potential line VSL may be disposed below the pixel circuit of the second pixel SP2. The low potential line VSL may be connected to a second electrode RME2 of the first pixel SP1 through a thirty-third contact hole CNT33. The low potential line VSL may be connected to a second electrode RME2 of the second pixel SP2 through a thirty-fourth contact hole CNT34. The low potential line VSL may be connected to a second electrode RME2 of the third pixel SP3 through a thirty-fifth contact hole CNT35. Accordingly, the low potential line VSL may supply a low potential voltage received from the vertical voltage line VVSL or the second voltage line VL2 to the second electrode RME2 of each of the first to third pixels SP1, SP2, and SP3. In this embodiment, the second electrode RME2 of each of the first to third pixels SP1, SP2, and SP3 may be disposed in a fourth metal layer MTL4 on the third metal layer MTL3.

The bypass line BPL may include the first and second bypass lines BPL1 and BPL2. The first bypass line BPL1 may be disposed in the first metal layer MTL1, and may extend in the second direction (Y-axis direction). The first bypass line BPL1 may be disposed between the unit pixels UP that are adjacent in the first direction (X-axis direction). In FIG. 8, the first bypass line BPL1 may be disposed between the data line DL connected to the unit pixel UP disposed on a left side of the third display area DA3 and the high potential line VDL connected to the unit pixel UP disposed on a right side of the third display area DA3. The first bypass line BPL1 may be disposed between the initialization voltage line VIL connected to the unit pixel UP disposed on the left side of the third display area DA3 and the high potential line VDL connected to the unit pixel UP disposed on the right side of the third display area DA3.

The second bypass line BPL2 may be disposed in the third metal layer MTL3, and may extend in the first direction (X-axis direction). The second bypass line BPL2 may be connected to the first bypass line BPL1 through a fortieth contact hole CNT40. The second bypass line BPL2 may be disposed between the unit pixels UP that are adjacent to each other in the second direction (Y-axis direction). In FIG. 8, the second bypass line BPL2 may be disposed between the low potential line VSL adjacent to the unit pixel UP disposed on an upper side of the third display area DA3 and the gate line GL connected to the unit pixel UP disposed on a lower side of the third display area DA3.

The pixel circuit of the first pixel SP1 may include first to third transistors ST1, ST2, and ST3. The first transistor ST1 of the first pixel SP1 may include an active region ACT1, a gate electrode GE1, a drain electrode DE1, and a source electrode SE1. The active region ACT1 of the first transistor ST1 may be disposed in the active layer ACTL, and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed in the second metal layer MTL2. The gate electrode GE1 of the first transistor ST1 may be a part of the first capacitor electrode CPE1 of the capacitor C1. The first capacitor electrode CPE1 may be connected to a fourth connection electrode CE4 of the third metal layer MTL3 through an eighth contact hole CNT8, and the fourth connection electrode CE4 may be connected to a source electrode SE2 of the second transistor ST2 of the active layer ACTL through a seventh contact hole CNT7.

The drain electrode DE1 and the source electrode SE1 of the first transistor ST1 may be made conductive by heat treatment of the active layer ACTL. The drain electrode DE1 of the first transistor ST1 may be electrically connected to the high potential line VDL via the first connection electrode CE1. The drain electrode DE1 of the first transistor ST1 may receive a driving voltage from the high potential line VDL.

The source electrode SE1 of the first transistor ST1 may be electrically connected to a second connection electrode CE2 of the third metal layer MTL3 through a third contact hole CNT3. The second connection electrode CE2 may be connected to a second capacitor electrode CPE2 of the first metal layer MTL1 through a fourth contact hole CNT4. Accordingly, the capacitor C1 may be doubly formed between a first capacitor electrode CPE1 and the second capacitor electrode CPE2 and between the first capacitor electrode CPE1 and the second connection electrode CE2. The second connection electrode CE2 may be connected to a drain electrode DE3 of the third transistor ST3 through a ninth contact hole CNT9. The second connection electrode CE2 may be connected to a first electrode RME1 of the first pixel SP1 through a twelfth contact hole CNT12. The first electrode RME1 of the first pixel SP1 may be disposed in the fourth metal layer MTL4 on a via layer VIA.

The second transistor ST2 of the first pixel SP1 may include an active region ACT2, a gate electrode GE2, a drain electrode DE2, and a source electrode SE2. The active region ACT2 of the second transistor ST2 may be disposed in the active layer ACTL, and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the first data line DL1 through the third connection electrode CE3. The drain electrode DE2 of the second transistor ST2 may receive the data voltage of the first pixel SP1 from the first data line DL1.

The source electrode SE2 of the second transistor ST2 may be electrically connected to the first capacitor electrode CPE1 via the fourth connection electrode CE4. The source electrode SE2 of the second transistor ST2 may be electrically connected to the gate electrode GE1 of the first transistor ST1 through the first capacitor electrode CPE1.

The third transistor ST3 of the first pixel SP1 may include an active region ACT3, a gate electrode GE3, a drain electrode DE3, and a source electrode SE3. The active region ACT3 of the third transistor ST3 may be disposed in the active layer ACTL, and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the second connection electrode CE2 through the ninth contact hole CNT9. The second connection electrode CE2 may be connected to the source electrode SE1 of the first transistor ST1 through the third contact hole CNT3, and may be connected to the second capacitor electrode CPE2 of the first metal layer MTL1 through the fourth contact hole CNT4.

The source electrode SE3 of the third transistor ST3 may be electrically connected to the initialization voltage line VIL through the fifth connection electrode CE5. The source electrode SE3 of the third transistor ST3 may receive an initialization voltage from the initialization voltage line VIL. The source electrode SE3 of the third transistor ST3 may supply the sensing signal to the initialization voltage line VIL.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be disposed in the active layer ACTL, and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the first capacitor electrode CPE1 of the capacitor C1. The first capacitor electrode CPE1 may be connected to an eighth connection electrode CE8 of the third metal layer MTL3 through a nineteenth contact hole CNT19. The eighth connection electrode CE8 may be connected to the source electrode SE2 of the second transistor ST2 of the active layer ACTL through an eighteenth contact hole CNT18.

The drain electrode DE1 and the source electrode SE1 of the first transistor ST1 may be made conductive by heat treatment of the active layer ACTL. The drain electrode DE1 of the first transistor ST1 may be electrically connected to the high potential line VDL via the first connection electrode CE1. The drain electrode DE1 of the first transistor ST1 may receive a driving voltage from the high potential line VDL.

The source electrode SE1 of the first transistor ST1 may be electrically connected to a sixth connection electrode CE6 of the third metal layer MTL3 through a fourteenth contact hole CNT14. The sixth connection electrode CE6 may be connected to the second capacitor electrode CPE2 of the first metal layer MTL1 through a fifteenth contact hole CNT15. Accordingly, the capacitor C1 may be doubly formed between the first capacitor electrode CPE1 and the second capacitor electrode CPE2 and between the first capacitor electrode CPE1 and the sixth connection electrode CE6. The sixth connection electrode CE6 may be connected to the drain electrode DE3 of the third transistor ST3 through a twentieth contact hole CNT20. The sixth connection electrode CE6 may be connected to the first electrode RME1 of the second pixel SP2 through a twenty-third contact hole CNT23. The first electrode RME1 of the second pixel SP2 may be disposed in the fourth metal layer MTL4 on the via layer VIA.

The second transistor ST2 of the second pixel SP2 may include an active region ACT2, a gate electrode GE2, a drain electrode DE2, and a source electrode SE2. The active region ACT2 of the second transistor ST2 may be disposed in the active layer ACTL, and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the second data line DL2 through the seventh connection electrode CE7. The drain electrode DE2 of the second transistor ST2 may receive the data voltage of the second pixel SP2 from the second data line DL2.

The source electrode SE2 of the second transistor ST2 may be electrically connected to the first capacitor electrode CPE1 via the eighth connection electrode CE8. The source electrode SE2 of the second transistor ST2 may be electrically connected to the gate electrode GE1 of the first transistor ST1 through the first capacitor electrode CPE1.

The third transistor ST3 of the second pixel SP2 may include an active region ACT3, a gate electrode GE3, a drain electrode DE3, and a source electrode SE3. The active region ACT3 of the third transistor ST3 may be disposed in the active layer ACTL, and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the sixth connection electrode CE6 through the twentieth contact hole CNT20. The sixth connection electrode CE6 may be connected to the source electrode SE1 of the first transistor ST1 through the fourteenth contact hole CNT14, and may be connected to the second capacitor electrode CPE2 of the first metal layer MTL1 through the fifteenth contact hole CNT15.

The source electrode SE3 of the third transistor ST3 may be electrically connected to the initialization voltage line VIL through the ninth connection electrode CE9. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the third pixel SP3 may include first to third transistors ST1, ST2, and ST3. The first transistor ST1 of the third pixel SP3 may include an active region ACT1, a gate electrode GE1, a drain electrode DE1, and a source electrode SE1. The active region ACT1 of the first transistor ST1 may be disposed in the active layer ACTL, and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the first capacitor electrode CPE1 of the capacitor C1. The first capacitor electrode CPE1 may be connected to a twelfth connection electrode CE12 of the third metal layer MTL3 through a thirtieth contact hole CNT30. The twelfth connection electrode CE12 may be connected to the second source electrode SE2 of the second transistor ST2 of the active layer ACTL through a twenty-ninth contact hole CNT29.

The drain electrode DE1 and the source electrode SE1 of the first transistor ST1 may be made conductive by heat treatment of the active layer ACTL. The drain electrode DE1 of the first transistor ST1 may be electrically connected to the high potential line VDL via the first connection electrode CE1. The drain electrode DE1 of the first transistor ST1 may receive the driving voltage from the high potential line VDL.

The source electrode SE1 of the first transistor ST1 may be electrically connected to a tenth connection electrode CE10 of the third metal layer MTL3 through a twenty-fifth contact hole CNT25. The tenth connection electrode CE10 may be connected to the second capacitor electrode CPE2 of the first metal layer MTL1 through a twenty-sixth contact hole CNT26. Accordingly, the capacitor C1 may be doubly formed between the first capacitor electrode CPE1 and the second capacitor electrodes CPE2 and between the first capacitor electrode CPE1 and the tenth connection electrode CE10. The tenth connection electrode CE10 may be connected to the drain electrode DE3 of the third transistor ST3 through a thirty-first contact hole CNT31. The tenth connection electrode CE10 may be connected to the first electrode RME1 of the third pixel SP3 through a thirty-second contact hole CNT32. The first electrode RME1 of the third pixel SP3 may be disposed in the fourth metal layer MTL4 on the via layer VIA.

The second transistor ST2 of the third pixel SP3 may include an active region ACT2, a gate electrode GE2, a drain electrode DE2, and a source electrode SE2. The active region ACT2 of the second transistor ST2 may be disposed in the active layer ACTL, and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the third data line DL3 through the eleventh connection electrode CE11. The drain electrode DE2 of the second transistor ST2 may receive the data voltage of the third pixel SP3 from the third data line DL3.

The source electrode SE2 of the second transistor ST2 may be electrically connected to the first capacitor electrode CPE1 via the twelfth connection electrode CE12. The source electrode SE2 of the second transistor ST2 may be electrically connected to the gate electrode GE1 of the first transistor ST1 through the first capacitor electrode CPE1.

The third transistor ST3 of the third pixel SP3 may include an active region ACT3, a gate electrode GE3, a drain electrode DE3, and a source electrode SE3. The active region ACT3 of the third transistor ST3 may be disposed in the active layer ACTL, and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the tenth connection electrode CE10 through the thirty-first contact hole CNT31. The tenth connection electrode CE10 may be connected to the source electrode SE1 of the first transistor ST1 through the twenty-fifth contact hole CNT25, and may be connected to the second capacitor electrode CPE2 of the first metal layer MTL1 through the twenty-sixth contact hole CNT26.

The source electrode SE3 of the third transistor ST3 may be electrically connected to the initialization voltage line VIL through the ninth connection electrode CE9. The source electrode SE3 of the third transistor ST3 of the second pixel SP2 and the source electrode SE3 of the third transistor ST3 of the third pixel SP3 may be integral with each other, but are not limited thereto. The source electrode SE3 of the third transistor ST3 may receive the initialization voltage from the initialization voltage line VIL. The source electrode SE3 of the third transistor ST3 may supply the sensing signal to the initialization voltage line VIL.

In FIG. 7, the display device 10 may include the substrate SUB, the high potential line VDL, the buffer layer BF, the first transistor ST1, the gate insulating layer GI, the interlayer insulating layer ILD, the first connection electrode CE1, the second connection electrode CE2, the low potential line VSL, a passivation layer PV, the via layer VIA, a protrusion pattern BP, the first electrode RME1, the second electrode RME2, a first insulating layer PAS1, a first light blocking member BK1, a light emitting element ED, a second insulating layer PAS2, a first contact electrode CTE1, a second contact electrode CTE2, a third insulating layer PAS3, a wavelength conversion layer QDL, a fourth insulating layer PAS4, a planarization layer OC, a color filter CF, a second light blocking member BK2, and an anti-reflection layer ARL.

The substrate SUB may support the display device 10. The substrate SUB may be a base substrate or a base member. The substrate SUB may be a flexible substrate which can be bent, folded, or rolled. For example, the substrate SUB may include an insulating material such as a polymer resin such as polyimide (PI), or the like, but the disclosure is not limited thereto.

The high potential line VDL may be disposed in a first metal layer MTL1 on the substrate SUB. For example, the high potential line VDL may be formed as a single layer or multiple layers made of at least one of molybdenum (Mo), aluminum (Al), chromium (Cr), gold (Au), titanium (Ti), nickel (Ni), neodymium (Nd), copper (Cu), and an alloy thereof.

The buffer layer BF may be disposed on the high potential line VDL and the substrate SUB. The buffer layer BF may include a contact hole into which the first connection electrode CE1 is inserted. The buffer layer BF may include an inorganic material capable of preventing permeation of air or moisture. For example, the buffer layer BF may include inorganic layers laminated alternately.

The first transistor ST1 may be disposed on the buffer layer BF. The first transistor ST1 may include a semiconductor region (or active region) ACT1, the gate electrode GE1, the drain electrode DE1, and the source electrode SE1.

The semiconductor region ACT1, the drain electrode DE1, and the source electrode SE1 may be disposed in the active layer ACTL on the buffer layer BF. The semiconductor region ACT1 may overlap the gate electrode GE1 in the thickness direction (Z-axis direction), and may be insulated from the gate electrode GE1 by the gate insulating layer GI. The drain electrode DE1 and the source electrode SE1 may be provided by making a material of the semiconductor region ACT1 conductive.

The gate electrode GE1 may be disposed in the second metal layer MTL2 on the gate insulating layer GI. The gate electrode GE1 may overlap the semiconductor region ACT1 with the gate insulating layer GI disposed therebetween.

The gate insulating layer GI may be disposed on the semiconductor region ACT1, the drain electrode DE1, the source electrode SE1, and the buffer layer BF. The gate insulating layer GI may insulate the gate electrode GE1 from the semiconductor region ACT1. The gate insulating layer GI may include contact holes into which each of the first and second connection electrodes CE1 and CE2 are inserted.

The interlayer insulating layer ILD may be disposed on the gate electrode GE1 and the gate insulating layer GI. The interlayer insulating layer ILD may include contact holes into which each of the first and second connection electrodes CE1 and CE2 are inserted.

The first and second connection electrodes CE1 and CE2 and the low potential line VSL may be disposed to be spaced apart from each other in the third metal layer MTL3 on the interlayer insulating layer ILD. The first connection electrode CE1 may electrically connect the high potential line VDL to the drain electrode DE1 of the first transistor ST1. The second connection electrode CE2 may electrically connect the source electrode SE1 of the first transistor ST1 to the first electrode RME1. The low potential line VSL may supply a low potential voltage to the second electrode RME2.

The passivation layer PV may be disposed on the third metal layer MTL3 and the interlayer insulating layer ILD. The passivation layer PV may protect the first transistor ST1. The passivation layer PV may include the twelfth contact hole CNT12 into which the first electrode RME1 is inserted and the thirty-third contact hole CNT33 into which the second electrode RME2 is inserted.

The via layer VIA may be disposed on the passivation layer PV to planarize an upper portion of the first transistor ST1. The via layer VIA may include the twelfth contact hole CNT12 into which the first electrode RME1 is inserted and the thirty-third contact hole CNT33 into which the second electrode RME2 is inserted. The via layer VIA may include an organic insulating material such as polyimide (PI), or the like.

The protrusion pattern BP may be disposed on the via layer VIA. The protrusion pattern BP may protrude from a top surface of the via layer VIA. The protrusion patterns BP may be disposed in an opening area or an emission area of each of the pixels. Light emitting elements ED may be arranged between the protrusion patterns BP. The protrusion pattern BP may have inclined side surfaces, and light emitted from the light emitting elements ED may be reflected by the first and second electrodes RME1 and RME2 arranged on the protrusion patterns BP. For example, the protrusion pattern BP may include an organic insulating material such as polyimide (PI). However, the embodiments are not limited thereto.

The first electrode RME1 may be disposed on the via layer VIA and the protrusion pattern BP. The first electrode RME1 may be disposed on the protrusion pattern BP located on a side of the light emitting elements ED. The first electrode RME1 may be disposed on the inclined side surfaces of the protrusion pattern BP, and may reflect the light emitted from the light emitting element ED. The first electrode RME1 may be inserted into the twelfth contact hole CNT12 provided in the via layer VIA and the passivation layer PV to be connected to the second connection electrode CE2. The first electrode RME1 may be electrically connected to an end of the light emitting element ED through the first contact electrode CTE1. Accordingly, the first electrode RME1 may receive a voltage proportional to a luminance of the light emitting element ED from a pixel circuit of a pixel, and may supply it to an end of the light emitting element ED.

The second electrode RME2 may be disposed on the via layer VIA and the protrusion pattern BP. The second electrode RME2 may be disposed on the protrusion pattern BP located on another side of the light emitting elements ED. The second electrode RME2 may be disposed on the inclined side surfaces of the protrusion pattern BP, and may reflect the light emitted from the light emitting element ED. The second electrode RME2 may be inserted into the thirty-third contact hole CNT33 provided in the via layer VIA and the passivation layer PV to be connected to the low potential line VSL. The second electrode RME2 may be electrically connected to another end of the light emitting element ED through the second contact electrode CTE2. Accordingly, the second electrode RME2 may supply a low potential voltage received from the second voltage line VL2 to another end of the light emitting element ED.

The first insulating layer PAS1 may be disposed on the via layer VIA and the first and second electrodes RME1 and RME2. The first insulating layer PAS1 may protect and insulate the first electrode RME1 and the second electrode RME2 from each other. The first insulating layer PAS1 may prevent damage caused by direct contact between the light emitting element ED and the first electrode RME1 and between the light emitting element ED and the second electrode RME2 in an alignment process of the light emitting element ED.

The first light blocking member BK1 may be disposed on the first insulating layer PAS1. The first light blocking member BK1 may define an emission area or an opening area of each of the first to third pixels SP1, SP2, and SP3. The first light blocking member BK1 may be disposed at a boundary between the first to third pixels SP1, SP2, and SP3 to distinguish the light emitting elements ED of respective pixels. The first light blocking member BK1 may be formed at a height (e.g., a predetermined or selectable height), and may include an organic insulating material such as polyimide (PI). However, the embodiments are not limited thereto.

The light emitting elements ED may be arranged on the first insulating layer PAS1. The light emitting elements ED may be arranged in parallel to each other between the first electrode RME1 and the second electrode RME2. A length of the light emitting element ED may be greater than a length between the first electrode RME1 and the second electrode RME2. The light emitting element ED may include semiconductor layers, and an end and another end opposite to the end may be defined with respect to any one semiconductor layer. The end of the light emitting element ED may be disposed on the first electrode RME1, and another end of the light emitting element ED may be disposed on the second electrode RME2. The end of the light emitting element ED may be electrically connected to the first electrode RME1 through the first contact electrode CTE1, and another end of the light emitting element ED may be electrically connected to the second electrode RME2 through the second contact electrode CTE2.

The light emitting element ED may have a size in a range of micro-meter to nano-meter, and may be an inorganic light emitting diode including an inorganic material. The inorganic light emitting diode may be aligned between the first electrode RME1 and the second electrode RME2 facing each other by an electric field formed in a specific direction between the first electrode RME1 and the second electrode RME2.

The second insulating layer PAS2 may be disposed on the light emitting elements ED and the first light blocking member BK1. For example, the second insulating layer PAS2 may partially surround the light emitting elements ED, and may not cover ends (e.g., both ends) of each of the light emitting elements ED. The second insulating layer PAS2 may protect the light emitting elements ED, and may fix the light emitting elements ED in a manufacturing process of the display device 10. The second insulating layer PAS2 may fill a space between the light emitting element ED and the first insulating layer PAS1.

The first contact electrode CTE1 may be disposed on the first insulating layer PAS1, and may be connected to the first electrode RME1 while being inserted into the contact hole provided in the first insulating layer PAS1. For example, the contact hole of the first insulating layer PAS1 may be disposed on the protrusion pattern BP, but the disclosure is not limited thereto. An end of the first contact electrode CTE1 may be connected to the first electrode RME1 on the protrusion pattern BP, and another end of the first contact electrode CTE1 may be connected to the end of the light emitting element ED.

The second contact electrode CTE2 may be disposed on the first insulating layer PAS1, and may be connected to the second electrode RME2 while being inserted into the contact hole provided in the first insulating layer PAS1. For example, the contact hole of the first insulating layer PAS1 may be disposed on the protrusion pattern BP, but the disclosure is not limited thereto. An end of the second contact electrode CTE2 may be connected to another end of the light emitting element ED, and another end of the second contact electrode CTE2 may be connected to the second electrode RME2 on the protrusion pattern BP.

The third insulating layer PAS3 may be disposed on the second contact electrode CTE2 and the second insulating layer PAS2. The third insulating layer PAS3 may cover the second contact electrode CTE2, and may insulate the first and second contact electrodes CTE1 and CTE2 from each other.

The wavelength conversion layer QDL may be disposed on the first contact electrode CTE1 and the third insulating layer PAS3. The wavelength conversion layer QDL may be disposed in the emission area or the opening area of each of the first to third pixels SP1, SP2, and SP3. The wavelength conversion layer QDL may be surrounded by the first light blocking member BK1 in a plan view. The wavelength conversion layer QDL may convert or shift a peak wavelength of incident light. For example, the wavelength conversion layer QDL may convert blue light provided from the light emitting elements ED into red light or green light, and may emit converted light (e.g., the red light or green light). For another example, the wavelength conversion layer QDL may transmit blue light provided from the light emitting elements ED.

The fourth insulating layer PAS4 may be disposed on the wavelength conversion layer QDL and the third insulating layer PAS3. The fourth insulating layer PAS4 may seal the wavelength conversion layer QDL to prevent damage or contamination of the wavelength conversion layer QDL. For example, the fourth insulating layer PAS4 may include an inorganic material.

The planarization layer OC may be disposed on the fourth insulating layer PAS4 to planarize an upper portion of the wavelength conversion layer QDL. For example, the planarization layer OC may include an organic insulating material such as polyimide (PI), or the like.

The color filter CF may be disposed on the planarization layer OC in the emission area or the opening area. The color filter CF may be surrounded by the second light blocking member BK2 in a plan view. The color filter CF may overlap the wavelength conversion layer QDL in the thickness direction (Z-axis direction). The color filter CF may selectively transmit a specific color and block or absorb other colors. For example, the color filter CF may include a red, green, or blue colorant.

The second light blocking member BK2 may be disposed on the planarization layer OC to cover an edge of the color filter CF. The second light blocking member CK2 may overlap the first light blocking member BK1 in the thickness direction (Z-axis direction). The second light blocking member BK2 may block transmission of light. The second light blocking member BK2 may prevent light from penetrating among the first to third pixels SP1, SP2, and SP3 and mixing colors, thereby improving color reproducibility of the display device 10. The second light blocking member BK2 may be disposed in a grid shape that surrounds the first to third pixels SP1, SP2, and SP3 in a plan view.

The anti-reflection layer ARL may be disposed on the color filter CF and the second light blocking member BK2. The anti-reflection layer ARL may include a first inorganic layer, an organic layer, and a second inorganic layer. The organic layer may be disposed on the first inorganic layer, and the second inorganic layer may be disposed on the organic layer. The first inorganic layer and the second inorganic layer may include different materials from each other. For example, the first inorganic layer may include SiON, and the second inorganic layer may include $SiO_x$. Light, which has been reflected from an interface between the first inorganic layer and the organic layer, and light, which has been reflected from an interface between the organic layer and the second inorganic layer, may be canceled by destructive interference. Accordingly, the anti-reflection layer ARL may suppress a decrease in visibility due to the reflection of external light. The anti-reflection layer ARL may be omitted. For another example, the anti-reflection layer ARL may be replaced with a polarizing film.

Figure 9:
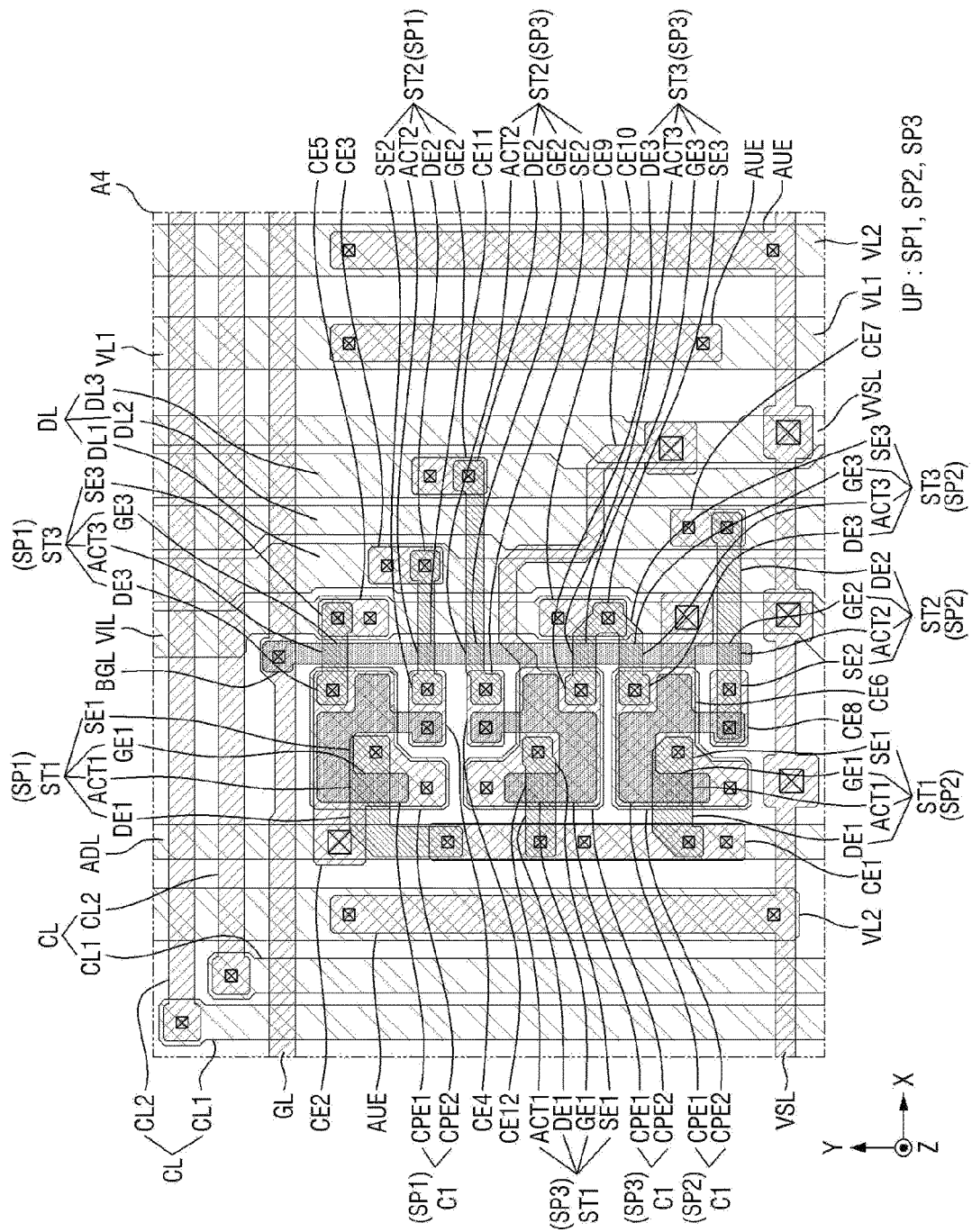
FIGS. 9 and 10 are schematic enlarged views of area A4 of FIG. 3.
Figure 10:
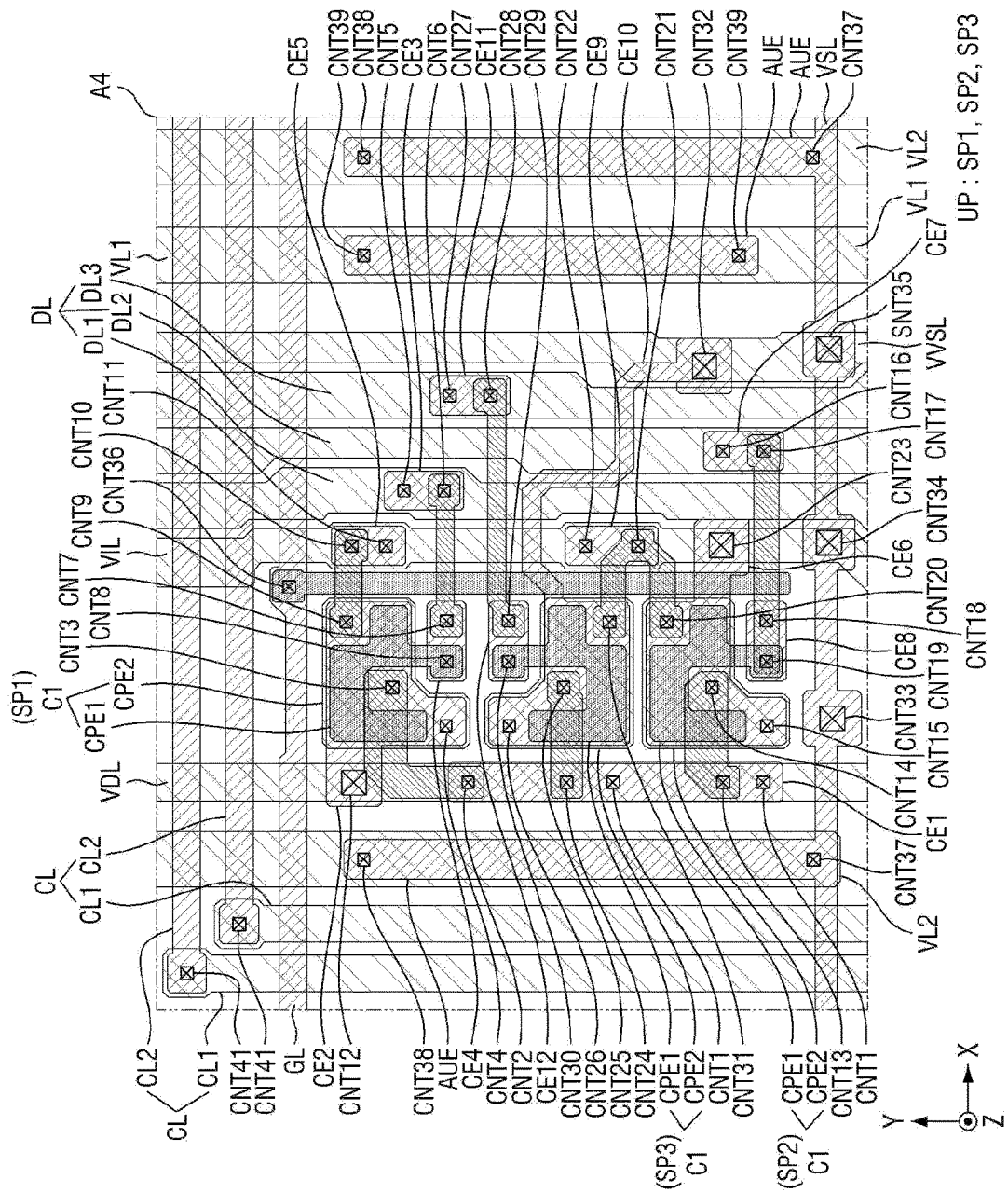
Figure 11:
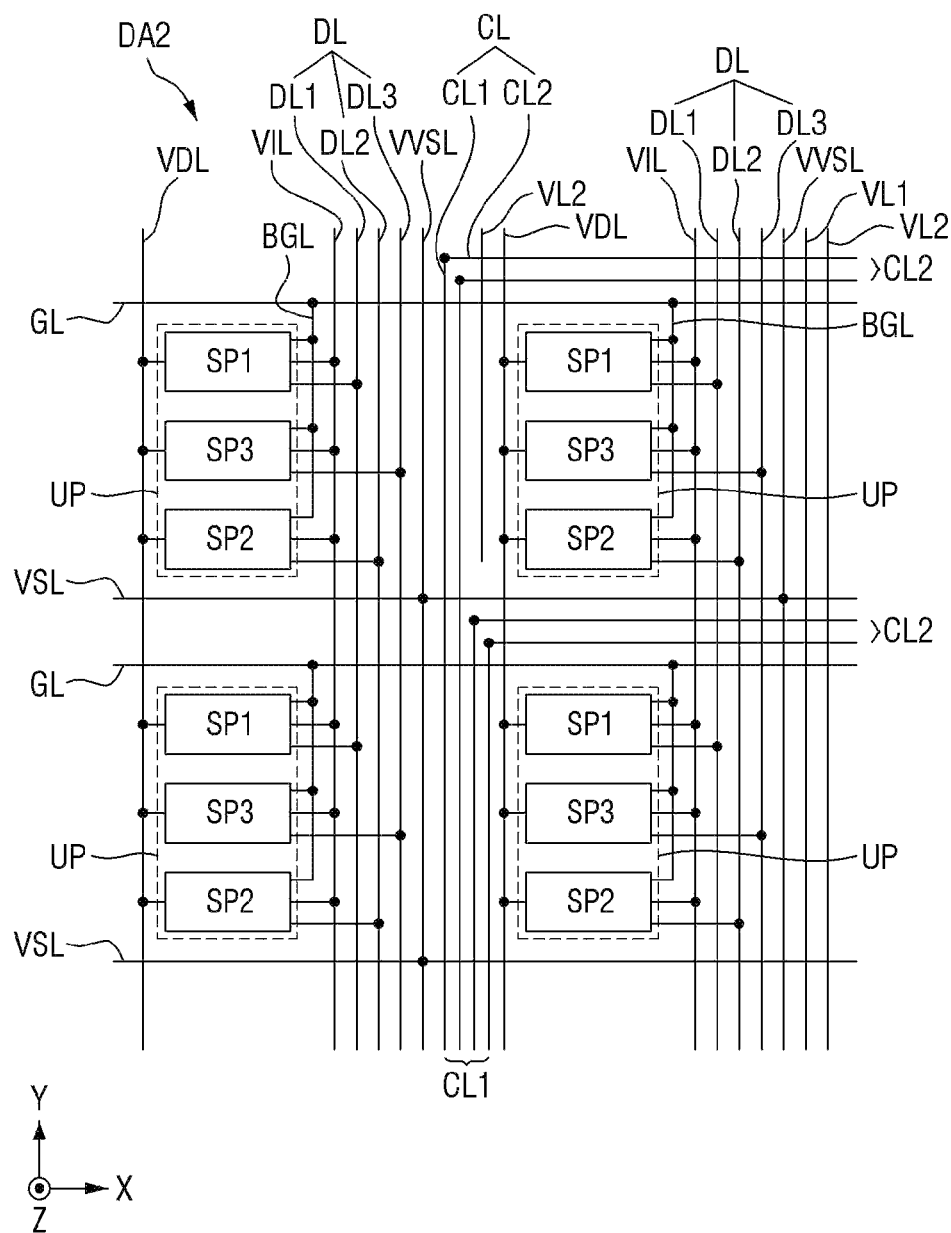
FIG. 11 is a schematic view illustrating pixels and lines in a second display area in a display device according to an embodiment.

FIGS. 9 and 10 are schematic enlarged views of area A4 of FIG. 3. FIGS. 9 and 10 illustrate by dividing reference numerals of a same view. FIG. 11 is a schematic view illustrating pixels and lines in a second display area in a display device according to an embodiment. Hereinafter, same configurations as above-described configurations will be briefly described, or a description thereof will be omitted.

Referring to FIGS. 9 to 11, the second display area DA2 may include the unit pixel UP, the high potential line VDL, the gate line GL, the auxiliary gate line BGL, the initialization voltage line VIL, the data line DL, the vertical voltage line VVSL, the low potential line VSL, the first voltage line VL1, the second voltage line VL2, and the connection line CL. The unit pixels UP may include first to third pixels SP1, SP2, and SP3. The pixel circuit of the first pixel SP1, the pixel circuit of the third pixel SP3 and the pixel circuit of the second pixel SP2 may be arranged in a direction opposite to the second direction (Y-axis direction).

The high potential line VDL may be disposed in the first metal layer MTL1 on the substrate SUB, and may extend in the second direction (Y-axis direction). The high potential line VDL may be disposed on a left side of the pixel circuits of the first to third pixels SP1, SP2, and SP3. The high potential line VDL may supply a high potential voltage to each of the first to third pixels SP1, SP2, and SP3.

The gate line GL may be disposed in the third metal layer MTL3 on the interlayer insulating layer ILD, and may extend in the first direction (X-axis direction). The gate line GL may supply a gate signal received from the stage STG to the auxiliary gate line BGL.

The auxiliary gate line BGL may be disposed on the second metal layer MTL2. The auxiliary gate line BGL may supply the gate signals received from the gate line GL to the first to third pixels SP1, SP2, and SP3.

The initialization voltage line VIL may be disposed in the first metal layer MTL1, and may extend in the second direction (Y-axis direction). The initialization voltage line VIL may be disposed on a right side of the auxiliary gate line BGL. The initialization voltage line VIL may supply an initialization voltage to the third transistor ST3 of each of the first to third pixels SP1, SP2, and SP3, and may receive the sensing signal from the third transistor ST3.

The first data line DL1 may be disposed in the first metal layer MTL1, and may extend in the second direction (Y-axis direction). The first data line DL1 may be disposed on a right side of the initialization voltage line VIL. The first data line DL1 may supply a data voltage to the second transistor ST2 of the first pixel SP1.

The second data line DL2 may be disposed in the first metal layer MTL1, and may extend in the second direction (Y-axis direction). The second data line DL2 may be disposed on a right side of the first data line DL1. The second data line DL2 may supply a data voltage to the second transistor ST2 of the second pixel SP2.

The third data line DL3 may be disposed in the first metal layer MTL1, and may extend in the second direction (Y-axis direction). The third data line DL3 may be disposed on a right side of the second data line DL2. The third data line DL3 may supply a data voltage to the second transistor ST2 of the third pixel SP3.

The vertical voltage line VVSL may be disposed in the first metal layer MTL1, and may extend in the second direction (Y-axis direction). The vertical voltage line VVSL may be disposed on a right side of the third data line DL3. The vertical voltage line VVSL may supply a low potential voltage to the low potential line VSL.

The first voltage line VL1 may be disposed in the first metal layer MTL1, and may extend in the second direction (Y-axis direction). The first voltage line VL1 may be disposed on a right side of the vertical voltage line VVSL. The first voltage line VL1 may be electrically connected to the high potential line VDL.

The second voltage line VL2 may be disposed in the first metal layer MTL1, and may extend in the second direction (Y-axis direction). The second voltage line VL2 may be disposed on a right side of the first voltage line VL1. The second voltage line VL2 may reduce line resistance by being connected to the auxiliary electrode AUE. The auxiliary electrode AUE, which is connected to the second voltage line VL2, may be integral with the low potential line VSL, but is not limited thereto.

The low potential line VSL may be disposed in the third metal layer MTL3, and may extend in the first direction (X-axis direction). The low potential line VSL may be disposed below the pixel circuit of the second pixel SP2. The low potential line VSL may supply a low potential voltage received from the vertical voltage line VVSL or the second voltage line VL2 to the second electrode RME2 of each of the first to third pixels SP1, SP2, and SP3.

The connection line CL may include the first and second connection lines CL1 and CL2. The first connection line CL1 may be disposed in the first metal layer MTL1, and may extend in the second direction (Y-axis direction). The first connection line CL1 may be disposed between the unit pixels UP that are adjacent to each other in the first direction (X-axis direction). In FIG. 11, the first connection line CL1 may be disposed between the data line DL connected to the unit pixel UP disposed on a left side of the second display area DA2 and the high potential line VDL connected to the unit pixel UP disposed on a right side of the second display area DA2. The first connection line CL1 may be disposed between the initialization voltage line VIL connected to the unit pixel UP disposed on the left side of the second display area DA2 and the high potential line VDL connected to the unit pixel UP disposed on the right side of the second display area DA2.

The second connection line CL2 may be disposed in the third metal layer MTL3, and may extend in the first direction (X-axis direction). The second connection line CL2 may be connected to the first connection line CL1 through a forty-first contact hole CNT41. The second connection line CL2 may be disposed between the unit pixels UP that are adjacent in the second direction (Y-axis direction). In FIG. 11, the second connection line CL2 may be disposed between the low potential line VSL adjacent to the unit pixel UP disposed on an upper side of the second display area DA2 and the gate line GL connected to the unit pixel UP disposed on a lower pixel of the second display area DA2.

Figure 12:
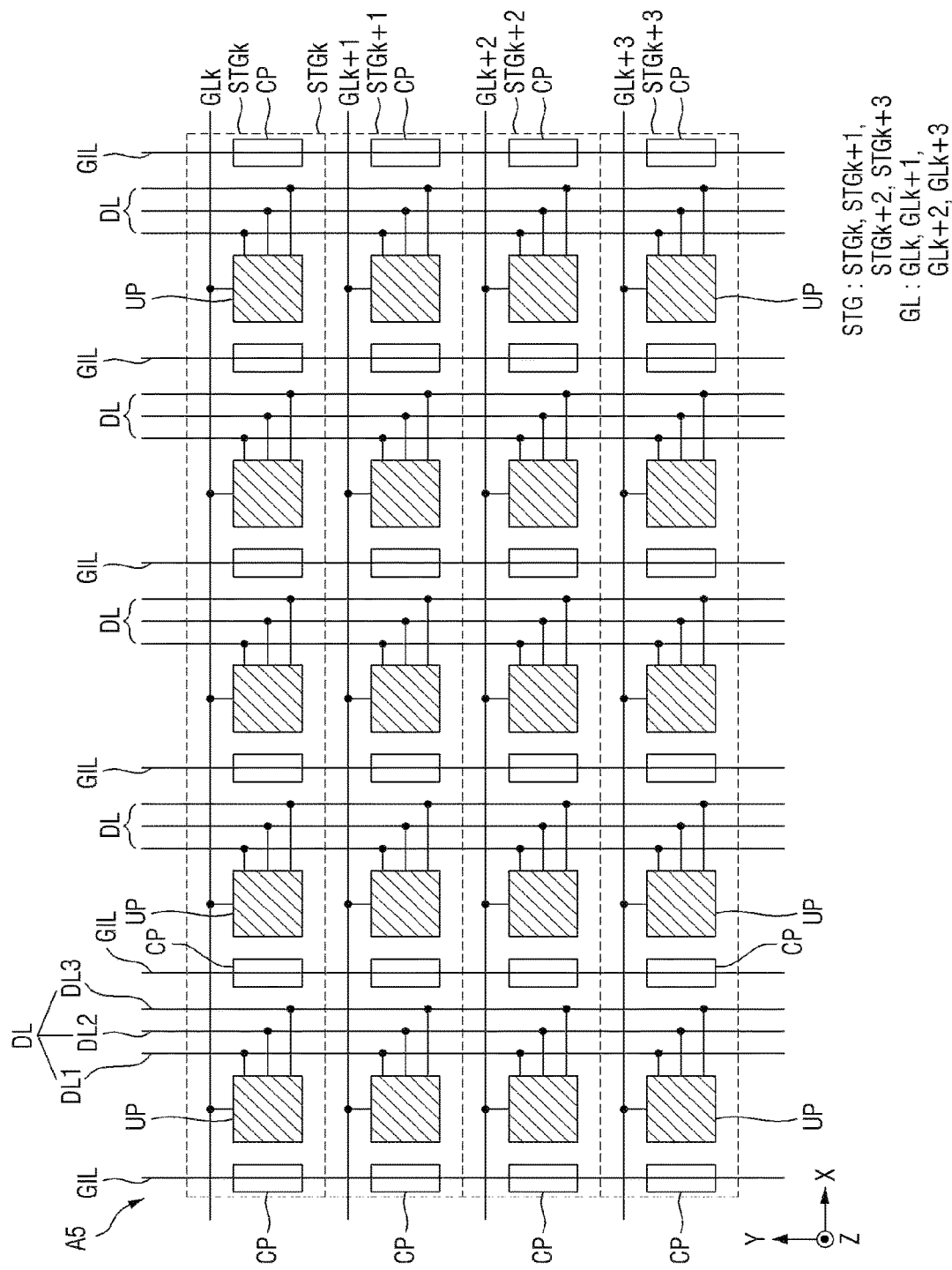
FIG. 12 is a schematic enlarged view of area A5 of FIG. 3.

FIG. 12 is a schematic enlarged view of area A5 of FIG. 3.

Referring to FIG. 12, the first display area DA1 may include the unit pixels UP, the data lines DL, the gate lines GL, the stages STG, and the gate input lines GIL.

Each of the unit pixels UP may be connected to the data line DL and the gate line GL. The unit pixels UP may include first to third pixels SP1, SP2, and SP3. Each of the first to third pixels SP1, SP2, and SP3 may include a pixel circuit and the light emitting element ED. The pixel circuit may supply a driving current proportional to the data voltage of the data line DL to the light emitting element, and the light emitting element ED may emit light having a luminance determined based on a magnitude of the driving current.

The data lines DL may extend in the second direction (Y-axis direction), and may be spaced apart from each other in the first direction (X-axis direction). The data line DL may be disposed between two unit pixels UP that are adjacent in the first direction (X-axis direction). The data line DL may supply the data voltage received from the display driver 220 to the unit pixel UP. Each of the first to third data lines DL1, DL2, and DL3 may supply a data voltage to each of the first to third pixels SP1, SP2, and SP3. The data voltage may determine the luminance of each of the first to third pixels SP1, SP2, and SP3.

The gate lines GL may extend in the first direction (X-axis direction), and may be spaced apart from each other in the second direction (Y-axis direction) intersecting the first direction (X-axis direction). Each of the gate lines GL may be connected to each of the stages STG disposed in the first display area DA1. For example, the gate lines GL may include a $k^{th}$ gate line GLk, where k is a positive integer, a $(k+1)^{th}$ gate line GLk+1, a $(k+2)^{th}$ gate line GLk+2, and a $(k+3)^{th}$ gate line GLk+3. Each of the gate lines GL may supply a gate signal to the unit pixels UP disposed in a same row.

The stages STG may be disposed in the first display area DA1 to supply gate signals to the gate lines GL. For example, the stages STG may include a $k^{th}$ stage STGk, a $(k+1)^{th}$ stage STGk+1, a $(k+2)^{th}$ stage STGk+2, and a $(k+3)^{th}$ stage STGk+3. The $k^{th}$ stage STGk may supply a gate signal to the $k^{th}$ gate line GLk, and the $(k+1)^{th}$ stage STGk+1 may supply a gate signal to the $(k+1)^{th}$ gate line GLk+1. The $(k+2)^{th}$ stage STGk+2 may supply a gate signal to the $(k+2)^{th}$ gate line GLk+2, and the $(k+3)^{th}$ stage STGk+3 may supply a gate signal to the $(k+3)^{th}$ gate line GLk+3.

The stage STG may include circuit parts CP. Each of the circuit parts CP may be disposed between the unit pixels UP that are adjacent to each other in the first direction (X-axis direction). The circuit part CP may include at least one transistor or at least one capacitor. Since each of the stages STG includes the circuit parts CP, it may be disposed over several unit pixels UP or tens of unit pixels UP. The circuit part CP may be connected to the gate input line GIL. The circuit part CP may receive the gate input signal, the clock signal, or the power voltage from the gate input line GIL. The stage STG may include the circuit parts CP to generate a gate signal and supply the gate signal to the gate line GL connected thereto.

Accordingly, since the display device 10 includes the gate input line GIL and the stage STG disposed in the first display area DA1, a size of the non-display area NDA may be minimized. The display device 10 is capable of minimizing the size of the non-display area NDA compared to an embodiment where the stages STG are disposed in the non-display area NDA or an embodiment where the stages STG are disposed on a separate flexible film.

Figure 13:
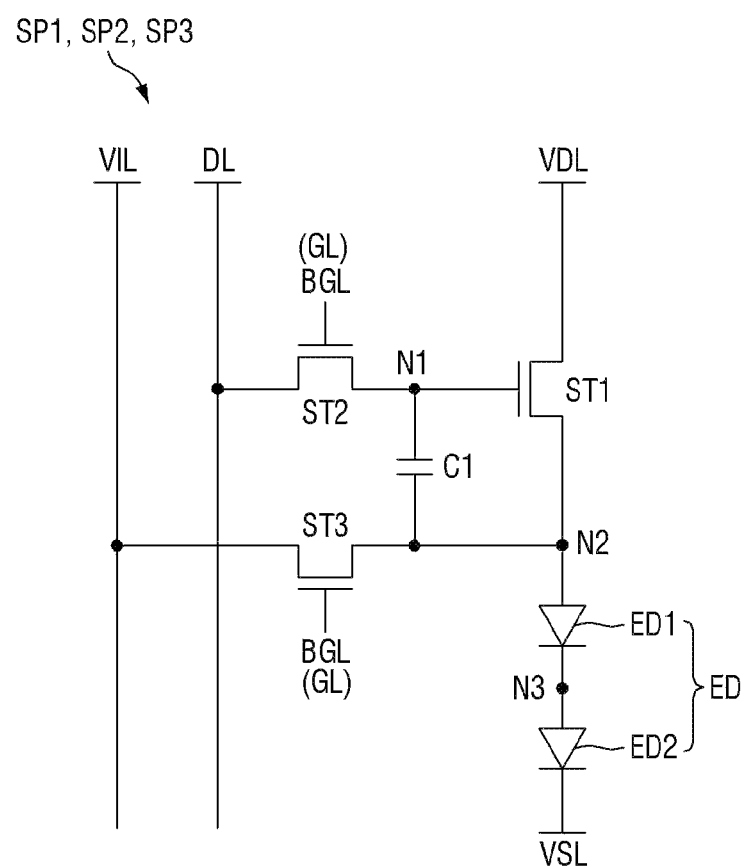
FIG. 13 is a schematic diagram of an equivalent circuit illustrating a pixel of a display device according to an embodiment.

FIG. 13 is a schematic diagram of an equivalent circuit illustrating a pixel of a display device according to an embodiment.

Referring to FIG. 13, each of the first to third pixels SP1, SP2, and SP3 may be connected to the high potential line VDL, the data line DL, the initialization voltage line VIL, the auxiliary gate line BGL, and the low potential line VSL.

Each of the first to third pixels SP1, SP2, and SP3 may include first to third transistors ST1, ST2, and ST3, a capacitor C1, and light emitting elements ED.

The first transistor ST1 may include a gate electrode, a drain electrode, and a source electrode. The gate electrode of the first transistor ST1 may be connected to a first node N1, the drain electrode thereof may be connected to the high potential line VDL, and the source electrode thereof may be connected to a second node N2. The first transistor ST1 may control a drain-source current (or driving current) based on a data voltage applied to the gate electrode.

The light emitting elements ED may include a first light emitting element ED1 and a second light emitting element ED2. The first and second light emitting elements ED1 and ED2 may be connected in series. The first and second light emitting elements ED1 and ED2 may receive a driving current to emit light. A light emission amount or the luminance of the light emitting element ED may be proportional to the magnitude of the driving current. For example, the light emitting element ED may be an inorganic light emitting element including an inorganic semiconductor, but is not limited thereto. As another example, the light emitting element ED may be a quantum dot light emitting diode including a quantum dot light emitting layer, an organic light emitting diode including an organic light emitting layer, or an ultra-small light emitting diode. A configuration of the light emitting element layer of the display device 10 may be changed in design according to a type of the light emitting element ED.

The first electrode of the first light emitting element ED1 may be connected to the second node N2, and the second electrode of the first light emitting element ED1 may be connected to a third node N3. The first electrode of the first light emitting element ED1 may be connected to the source electrode of the first transistor ST1, the drain electrode of the third transistor ST3, and a second capacitor electrode of the capacitor C1 through the second node N2. The second electrode of the first light emitting element ED1 may be connected to the first electrode of the second light emitting element ED2 through the third node N3.

The first electrode of the second light emitting element ED2 may be connected to the third node N3, and the second electrode of the second light emitting element ED2 may be connected to the low potential line VSL. The first electrode of the second light emitting element ED2 may be connected to the second electrode of the first light emitting element ED1 through the third node N3.

The second transistor ST2 may be turned on by the gate signal of the gate line GL or the auxiliary gate line BGL to electrically connect the data line DL to the first node N1 which is the gate electrode of the first transistor ST1. The second transistor ST2 may be turned on according to the gate signal to supply the data voltage to the first node N1. The gate electrode of the second transistor ST2 may be connected to the auxiliary gate line BGL, the drain electrode thereof may be connected to the data line DL, and the source electrode thereof may be connected to the first node N1. The source electrode of the second transistor ST2 may be connected to the gate electrode of the first transistor ST1 and a first capacitor electrode of the capacitor C1 through the first node N1.

The third transistor ST3 may be turned on by the gate signal of the auxiliary gate line BGL or the gate line GL to connect the initialization voltage line VIL to the second node N2 that is the source electrode of the first transistor ST1. The third transistor ST3 may be turned on according to the gate signal to supply the initialization voltage to the second node N2. The gate electrode of the third transistor ST3 may be connected to the auxiliary gate line BGL, the drain electrode thereof may be connected to the second node N2, and the source electrode thereof may be connected to the initialization voltage line VIL. The drain electrode of the third transistor ST3 may be connected to the source electrode of the first transistor ST1, the second capacitor electrode of the capacitor C1 and the first electrode of the first light emitting element ED1 through the second node N2.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a first display area comprising:
        stages; and
        gate input lines electrically connected to the stages and extending in a first direction;
    a second display area adjacent to the first display area in a second direction intersecting the first direction and comprising data lines;
    a third display area adjacent to the second display area in the second direction and comprising data lines;
    connection lines electrically connected to the data lines of the third display area via the second display area; and
    bypass lines electrically connected to the stages via the third display area and the second display area.

2. The display device of claim 1, wherein each of the gate input lines and the bypass lines supplies a gate input signal or a clock signal to the stages.

3. The display device of claim 1, wherein the bypass lines comprise:
    a first bypass line extending in the first direction in the third display area; and
    a second bypass line electrically connected to the first bypass line and extending from the third display area to the stages.

4. The display device of claim 3, wherein
    the second bypass line intersects the data lines of the second display area, and
    the second bypass line is insulated from the data lines of the second display area.

5. The display device of claim 3, wherein the connection lines comprise:
    a first connection line extending in the first direction in the second display area; and
    a second connection line electrically connected to the first connection line and extending from the second display area to the data lines of the third display area.

6. The display device of claim 5, wherein
    the second connection line intersects the data lines of the second display area, and
    the second connection line is insulated from the data lines of the second display area.

7. The display device of claim 5, wherein
    the second connection line intersects the first bypass line in the third display area, and
    the second connection line is insulated from the first bypass line.

8. The display device of claim 3, further comprising:
    a flexible film adjacent to the first display area, the second display area, and the third display area in the first direction; and
    a display driver mounted on the flexible film.

9. The display device of claim 8, wherein
    the gate input lines extend from the flexible film to the first display area, and the gate input lines overlap the display driver on the flexible film in a plan view.

10. The display device of claim 8, wherein
the first bypass line extends from the flexible film to the third display area, and
the first bypass line is spaced apart from the display driver on the flexible film.

11. The display device of claim 8, wherein
the flexible film further comprises a data output line electrically connected between the data lines of the second display area and the display driver, and
the gate input lines, the first bypass line, and the data output line are formed of a same metal layer on the flexible film.

12. The display device of claim 11, wherein the data output line is disposed between the gate input lines and the first bypass line.

13. The display device of claim 3, wherein
each of the first display area, the second display area, and the third display area further comprises pixels emitting light,
the first bypass line is disposed between the pixels adjacent in the second direction, and
the second bypass line is disposed between the pixels adjacent in the first direction.

14. The display device of claim 13, wherein each of the stages comprises circuit parts electrically connected to the gate input lines and disposed between the pixels.

15. A display device comprising:
a first display area comprising:
stages; and
gate input lines electrically connected to the stages and extending in a first direction;
a second display area adjacent to the first display area in a second direction intersecting the first direction;
a third display area adjacent to the second display area in the second direction;
a flexible film adjacent to the first display area, the second display area, and the third display area in the first direction; and
bypass lines electrically connected to the stages via the flexible film, the third display area, and the second display area.

16. The display device of claim 15, wherein
each of the first display area, the second display area, and the third display area further comprises data lines extending in the first direction, and
the display device further comprises connection lines electrically connected to the data lines of the third display area via the second display area.

17. The display device of claim 16, wherein the bypass lines comprise:
a first bypass line extending in the first direction from the flexible film to the third display area; and
a second bypass line electrically connected to the first bypass line and extending from the third display area to the stages.

18. The display device of claim 17, wherein the connection lines comprise:
a first connection line extending in the first direction in the second display area; and
a second connection line electrically connected to the first connection line and extending from the second display area to the data lines of the third display area.

19. The display device of claim 15, further comprising:
a display driver mounted on the flexible film, wherein
the gate input lines extend from the flexible film to the first display area, and
the gate input lines overlap the display driver on the flexible film in a plan view.

20. The display device of claim 19, wherein
the flexible film further comprises a data output line electrically connected between data lines of the second display area and the display driver, and
the gate input lines, the bypass lines, and the data output line are formed of a same metal layer on the flexible film.

* * * * *